US007529533B2

(12) United States Patent  
Bellantoni

(10) Patent No.: US 7,529,533 B2  
(45) Date of Patent: May 5, 2009

(54) CONFIGURABLE HOMODYNE/HETERODYNE RADIO RECEIVER AND RFID READER EMPLOYING SAME

(75) Inventor: John Vincent Bellantoni, Redwood City, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 549 days.

(21) Appl. No.: 11/280,434

(22) Filed: Nov. 15, 2005

(65) Prior Publication Data

US 2007/0111697 A1 May 17, 2007

(51) Int. Cl.
*H04B 1/16* (2006.01)
(52) U.S. Cl. .............. 455/334; 455/147; 455/189.1; 455/209; 455/216; 455/324; 375/316; 375/324; 375/328; 375/349; 331/30; 331/42; 327/105; 327/119; 327/156
(58) Field of Classification Search ......... 455/207–216, 455/323, 324, 20, 76, 140–147, 154.1, 160.1–165.1, 455/189.1–196.1, 255–259, 275–277.1, 313–319, 455/334, 335; 361/56; 375/344, 136, 141, 375/147, 149, 150, 239, 316, 322, 324, 327, 375/328, 340, 347, 349, 376; 331/46, 22, 331/30, 37, 38, 40, 42, 43; 327/100–103, 327/105, 113, 116, 117, 119, 156
See application file for complete search history.

(56) References Cited

U.S. PATENT DOCUMENTS 5,970,105 A * 10/1999 Dacus ..................... 375/344

| | | | |
|---|---|---|---|
| 6,738,602 B1 * | 5/2004 | Heinen et al. ................ 455/76 |
| 6,836,648 B1 | 12/2004 | Ritter ..................... 455/277.1 |
| 7,266,361 B2 * | 9/2007 | Burdett ..................... 455/334 |
| 2001/0039182 A1 * | 11/2001 | Atkinson ..................... 455/20 |
| 2002/0127982 A1 * | 9/2002 | Haapoja et al. ............. 455/130 |
| 2002/0132590 A1 | 9/2002 | Marshall ..................... 455/73 |
| 2003/0067359 A1 * | 4/2003 | Darabi et al. ................ 331/46 |
| 2007/0030609 A1 * | 2/2007 | Reynolds ..................... 361/56 |

FOREIGN PATENT DOCUMENTS

| DE | 2441809 A | * | 3/1976 |
| EP | 1 207 627 A1 | | 5/2002 |
| EP | 1207627 | * | 5/2002 |

OTHER PUBLICATIONS

International Search Report and Written Opinion for International Application No. PCT/US2006/043832 mailed May 31, 2007.

* cited by examiner

*Primary Examiner*—Edward Urban
*Assistant Examiner*—Junpeng Chen
(74) *Attorney, Agent, or Firm*—Morgan, Lewis & Bockius, LLP.

(57) ABSTRACT

The embodiments of the present invention provide a configurable homodyne/heterodyne RF receiver including first and second mixers. The configurable homodyne/heterodyne RF receiver functions as a homodyne receiver when the first and second mixers are configured to operate in parallel, and as a heterodyne receiver when the first and second mixers are configured to operate in series. The embodiments of the present invention further provides an RFID reader employing the configurable homodyne/heterodyne RF receiver to facilitate a listen-before-talk function.

19 Claims, 16 Drawing Sheets

| Bandwidth | 200 | | kHz | | Input Power | -96 | | dBm | | | | | | |
|---|---|---|---|---|---|---|---|---|---|---|---|---|---|---|

| Stage Description | Stage Gain (dB) | Stage Noise Fig (dB) | Stage IP1dB (dBm) | Stage IIP3 (dBm) | Cum. Gain (dB) | Cum. Noise Fig (dB) | Cum. Noise Pow (dBm) | Cum. OP1dB (dBm) | Cum. OIP3 (dBm) | Spur Free Dyn Range (dB) | Min Disc Signal (dBm) | Cum. Pout (dBm) | P1dB - Pout (dB) | Index |
|---|---|---|---|---|---|---|---|---|---|---|---|---|---|---|
| Input Losses | -2.00 | 2.00 | 99.00 | 99.00 | -2.00 | 2.00 | -120.99 | 96.00 | 97.00 | -13.33 | -118.99 | -98.00 | 194.00 | 1.00 |
| LNA | 15.00 | 1.50 | 0.00 | 13.00 | 13.00 | 3.50 | -104.49 | 14.00 | 28.00 | -68.33 | -117.49 | -83.00 | 97.00 | 2.00 |
| Pwr Divider | -3.00 | 3.00 | 99.00 | 99.00 | 10.00 | 3.60 | -107.39 | 11.00 | 25.00 | -68.26 | -117.39 | -86.00 | 181.00 | 3.00 |
| Mixer #1 | -11.00 | 12.00 | -6.00 | 10.00 | -1.00 | 5.77 | -116.22 | -18.07 | -1.14 | -76.90 | -115.22 | -97.00 | 79.00 | 4.00 |
| BPF 450 MHz | -1.00 | 1.00 | 99.00 | 99.00 | -2.00 | 6.13 | -116.86 | -19.07 | -2.14 | -76.67 | -114.86 | -98.00 | 195.00 | 5.00 |
| IF Amp 450 MHz | 25.00 | 5.00 | -20.00 | -10.00 | 23.00 | 8.77 | -89.22 | 1.85 | 14.34 | -80.59 | -112.22 | -73.00 | 77.00 | 6.00 |
| Mixer #2 | -14.00 | 15.00 | -15.00 | 5.00 | 9.00 | 8.85 | -103.14 | -30.07 | -9.48 | -87.06 | -112.14 | -87.00 | 57.00 | 7.00 |
| BPF 10.7 MHz | -5.00 | 5.00 | 99.00 | 99.00 | 4.00 | 9.00 | -107.98 | -35.07 | -14.48 | -86.98 | -111.98 | -92.00 | 185.00 | 8.00 |
| IF AMP 10.7 MHz | 30.00 | 5.00 | -20.00 | -30.00 | 34.00 | 9.45 | -77.54 | -5.58 | -5.04 | -100.38 | -111.54 | -62.00 | 66.00 | 9.00 |
| IQ Demodulator | 20.00 | 24.00 | -18.00 | -8.00 | 54.00 | 9.50 | -57.49 | 0.81 | 10.22 | -103.51 | -111.49 | -42.00 | 43.00 | 10.00 |
| THS7530 | 46.00 | 9.00 | -35.00 | -26.00 | 100.00 | 9.50 | -11.49 | 10.00 | 20.00 | -127.66 | -111.49 | 4.00 | 6.00 | 11.00 |

Explanation of terms used in the table:
Noise Fig — noise figure (dB)
IP1dB — input 1-dB-compressed power
IIP3 — input third-order intercept point
Cum. Gain. — cumulative gain at the relevant stage in the chain
Cum. Noise Fig — cumulative noise figure at the relevant stage in the chain
Cum. Noise Pow — cumulative noise power (dBm) at the relevant stage
Cum. OP1dB — cumulative output 1-dB-compressed power
Spur Free Dyn Range — spurious-free dynamic range
Min Disc signal — minimum discernable signal
Cum. Pout — cumulative output power at the relevant stage in the chain
P1dB-Pout — difference between 1-dB-compressed power and output power

CONFIGURABLE HOMODYNE/HETERODYNE RADIO RECEIVER AND RFID READER EMPLOYING SAME

FIELD OF THE INVENTION

The present invention relates in general to wireless communications using radio-frequency signals, and particularly to a convertible homodyne/heterodyne radio receiver and a radio frequency identification (RFID) reader employing same.

BACKGROUND OF THE INVENTION

A wireless device that is able to communicate with others using radio frequency (RF) signals is usually equipped with an RF transmitter and receiver. A conventional RF receiver may employ either a homodyne or a heterodyne receiver architecture. A homodyne receiver has its local oscillator (LO) frequency set to the same frequency as a carrier frequency in a received RF signal and makes a direct conversion from the RF carrier frequency to a baseband frequency for information recovery. Therefore, a homodyne receiver is sometimes referred to as direct conversion, or zero IF (meaning no intermediate frequency) receiver. The baseband frequency, or baseband, is in a range of frequencies occupied by the signal before modulation or after demodulation, and is typically substantially below the carrier frequency. Using the homodyne architecture, only one mixer stage is usually required to down-convert the received RF signal to baseband, resulting in lower power consumption and easier implementation of the receiver in an integrated circuit (IC) chip. However, because the LO frequency is tuned to the RF carrier frequency, self-reception may be an issue in a homodyne receiver.

In contrast, a heterodyne or superheterodyne receiver translates the RF carrier frequency in the received RF signal to one or more intermediate frequencies (IF) before demodulation. Modulation information is recovered from the last IF frequency. One or more LO signals are tuned to particular frequencies above or below the RF carrier frequency, and the RF and LO signals mix to produce the one or more IF frequencies. A heterodyne receiver is usually advantageous over a homodyne receiver because of its better selectivity and better immunity from interfering signals.

A heterodyne receiver, however, can be much more costly than a homodyne receiver. The received RF signal often includes unwanted signals that cause spurious responses at the IF frequency in addition to the desired signal. One spurious response is known to occur at a so-called image frequency. An RF filter known as a preselector filter is required to filter out the image signal unless an image-reject mixer is used. Moreover, additional crystal-stabilized oscillators are required for the heterodyne receiver. In addition to the added cost, these additional items also require extra receiver housing space and consume more power.

Traditionally, an RF receiver is designed with either the homodyne or the heterodyne architecture. There are situations, however, in which it is desirable to have an RF receiver that functions as a homodyne receiver for some operations and as a heterodyne receiver for some other operations. Such an RF receiver may be used, for example, in an RFID reader to facilitate a listen-before-talk (LBT) function required by the proposed European Telecommunications Standard Institute (ETSI) Standard, EN302 208-1.

RFID technologies are widely used for automatic identification. A basic RFID system includes an RFID tag or transponder carrying identification data and an RFID interrogator or reader, such as RFID reader, that reads and/or writes the identification data. An RFID tag typically includes a microchip for data storage and processing, and a coupling element, such as an antenna coil, for communication. Tags may be classified as active or passive. Active tags have built-in power sources while passive tags are powered by radio waves received from the reader and thus cannot initiate any communications. An RFID reader operates by writing data into the tags or interrogating tags for their data through a radio-frequency (RF) interface. An RFID reader for interrogating passive tags is typically designed to receive from the tags a backscattered portion of a signal transmitted from the reader and to extract information therefrom.

Conventionally, a homodyne receiver is the natural choice for an RFID reader during RFID operations because the received signal is merely a reflection of the transmitted signal and is thus at the same or slightly different frequency as that of the transmitted signal, with the slight difference being caused by, for example, a small Doppler shift. An RFID reader with the LBT function, however, is required to monitor in accordance with a defined listen time and immediately prior to each transmission for the presence of other signals within its intended sub-band of transmission, and can thus benefit from the superior performance, flexibility, and insensitivity to second-order distortion that are usually associated with a heterodyne receiver. But, it can be prohibitively expensive to incorporate two separate receivers in a low-cost RFID reader.

SUMMARY OF THE INVENTION

In general, the embodiments of the present invention provide a configurable homodyne/heterodyne radio frequency (RF) receiver having an RF input for receiving an RF signal and first and second signal outputs for outputting demodulated in-phase (I) and quadrature (Q) signals. The configurable homodyne/heterodyne RF receiver comprises a frequency synthesizer having an output for outputting a continuous wave signal at a specified frequency, and a first frequency divider coupled to the output of the frequency synthesizer. The configurable homodyne/heterodyne RF receiver further comprises first and second mixers coupled between the RF input and respective ones of the first and second signal outputs, a first RF switch coupled between the frequency synthesizer and the first and second mixers, and a second RF switch coupled to one of the first and second mixers. The first RF switch is configurable to switch between two different settings, one setting for utilizing the frequency divider to divide the frequency of the continuous wave signal from the frequency synthesizer before sending the continuous wave signal to the first and second mixers, and one setting for bypassing the frequency divider. The second RF switch is configurable to switch between two settings, one setting for allowing the first and second mixers to operate in series and one setting for letting the first and second mixers operate in parallel.

In one embodiment, the configurable homodyne/heterodyne RF receiver further comprises a baseband I/Q demodulator coupled between one of the first and second mixer and the first and second signal outputs, a first bandpass filter coupled between the first and second mixers and having a center frequency near a predetermined first intermediate frequency (IF), a second bandpass filter coupled between one of the first and second mixers and the baseband I/Q demodulator and having a center frequency near a predetermined second IF, and a crystal reference generator for generating a reference clock signal that is provided to the frequency synthesizer as a reference signal and to the baseband I/Q demodulator as a local oscillator signal.

The configurable homodyne/heterodyne RF receiver functions as a homodyne receiver when the first RF switch is configured to bypass the frequency divider and the second RF switch is configured to have the first and second mixers operate in parallel; and the RF receiver functions as a heterodyne receiver when the first RF switch is configured to utilize the frequency divider and the second RF switch is configured to have the first and second mixers operate in series.

In one embodiment, the configurable homodyne/heterodyne RF receiver is included in a listen-before-talk (LBT) radio frequency identification (RFID) reader to facilitate a listen-before-talk function required by the proposed ETSI Standard, EN302 208-1, for RFID operations. The LBT RFID reader employing the configurable homodyne/heterodyne RF receiver can be configured to operate in either a LISTEN mode or an INTERROGATE mode. In the LISTEN mode, the configurable homodyne/heterodyne RF receiver in the LBT RFID reader is configured as a heterodyne receiver, which uses the first and second of mixers and the frequency synthesizer to provide dual down conversions of the received signal. In the INTERROGATE mode, the same first and second mixers and the frequency synthesizer are used for I/Q demodulation of received signals. The LBT RFID reader can be built by adding minimal parts, such as the RF switches, the frequency divider, some filters, and a baseband demodulator to a conventional RFID reader to achieve considerable improvements in sensitivity, selectivity, and image rejection in the listen-before-talk operation.

Embodiments of the present invention further include a method of operating the LBT RFID reader. The method comprises the steps of configuring a first switch in the RFID reader to couple a frequency divider between the frequency synthesizer and the first and second mixers, and configuring a second switch in the RFID reader to allow the first and second mixers to operate in series. The method further comprises configuring the first switch in the RFID reader to bypass the frequency divider, and configuring the second switch in the RFID reader to allow first and second mixers in the RFID reader to operate in parallel.

BRIEF DESCRIPTION OF THE DRAWINGS

The skilled artisan will understand that the drawings, described below, are for purposes of illustration only, and are not intended to limit the scope of the present invention in any way.

FIG. 7A is a table summarizing chain analysis results for the LBT RFID reader operating in the LISTEN mode.

DETAILED DESCRIPTION OF THE INVENTION

Figure 1:
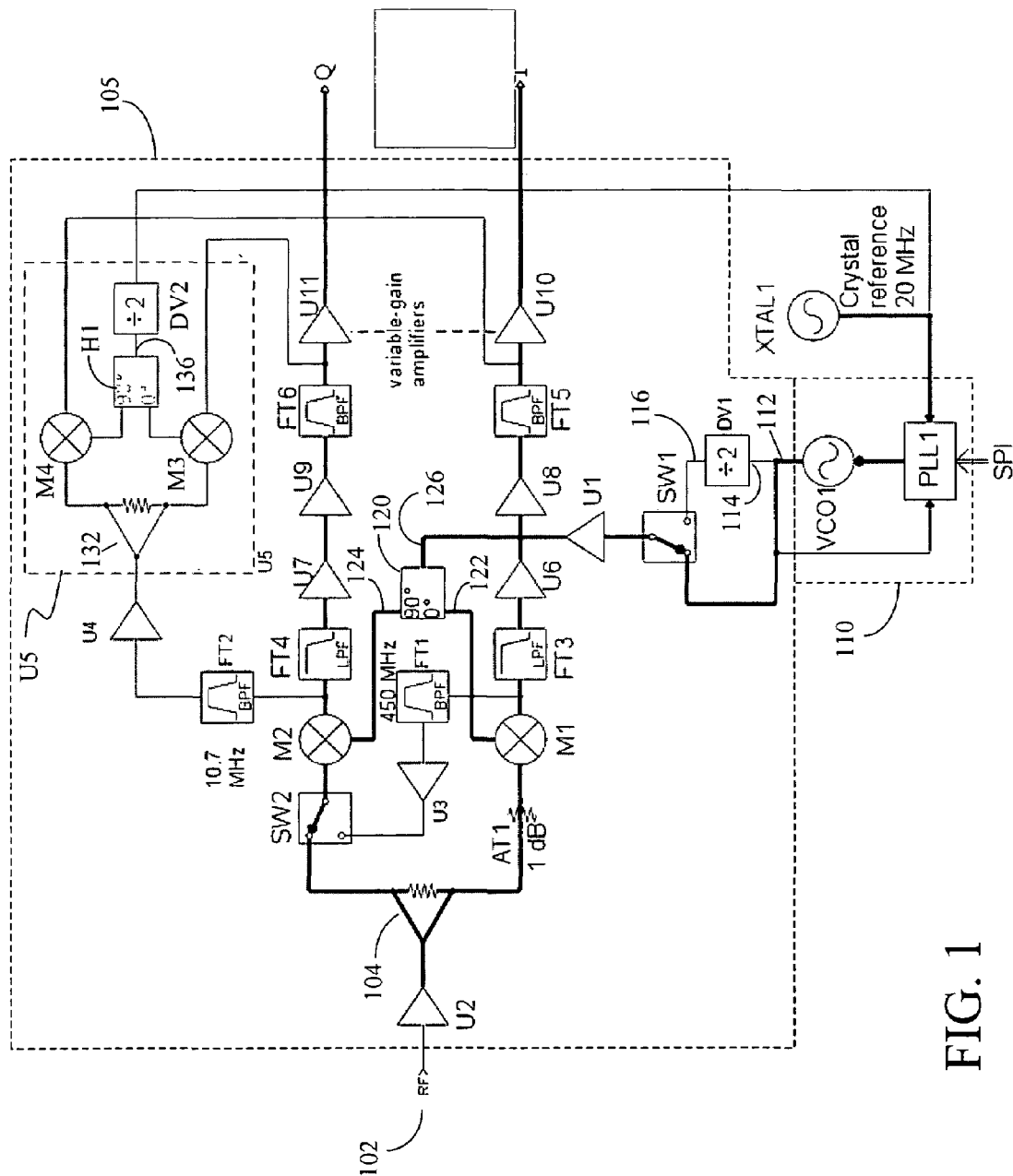
FIG. 1 is a block diagram of a configurable homodyne/heterodyne RF receiver configured as a homodyne receiver according to one embodiment of the present invention.

In one aspect, the present invention provides a configurable homodyne/heterodyne radio frequency (RF) receiver. Referring to FIG. 1, a configurable homodyne/heterodyne radio frequency (RF) receiver (RF receiver) 100 according to one embodiment of the present invention includes a crystal reference generator XTAL1 configured to generate a clock signal at a reference frequency $f_{ref}$, and a frequency synthesizer 110 configured to receive a control signal SP1, to form a first continuous wave (CW) signal at a specified frequency $f_{cw1}$ according to the control signal and using the clock signal as a reference, and to output the CW signal at its output 112.

RF receiver 100 further includes a configurable homodyne/heterodyne RF receiver module 105 having an RF input 102 for receiving an RF signal at an RF input frequency $f_{in}$ through an antenna (not shown), and first and second signal outputs I and Q for outputting demodulated in-phase (I) and quadrature (Q) signals, respectively, at a baseband frequency $f_{bb1}$. RF receiver module 105 further includes a first frequency divider DV1 coupled to output 112 of frequency synthesizer 110 and configured to receive the first CW signal at its input 114 and to output at its output 116 a second CW signal at a frequency $f_{cw2}$ that is half the frequency $f_{cw1}$.

RF receiver module 105 further includes components for constructing a homodyne I/Q demodulator, including, for example, a pair of mixers M1 and M2, and a 90° hybrid 120 having two outputs 122 and 124 coupled to mixers M1 and M2, respectively, and an input 126 for receiving a local oscillator (LO) signal, which may be either the first or the second CW signal. A first RF switch SW1 is coupled to input 126 of 90° hybrid 120 through an amplifier U1, to output 112 of frequency synthesizer 110, and to output 116 of frequency divider DV1. Switch SW1 is configured to switch between output 112 of frequency synthesizer 110 and output 116 of frequency divider DV1 so that 90° hybrid 108 receives either the first or the second CW signal.

RF receiver module 105 further includes a first bandpass filter FT1 coupled to an output of mixer M1, and a second RF switch SW2 coupled between bandpass filter FT1 and mixer M2 and between mixer M2 and RF input 102. Switch SW2 is configured to connect either bandpass filter FT1 or the RF input 102 to an input of mixer M2. RF receiver module 105 further includes a signal splitter 104 having an input coupled to the RF input 102 and two outputs coupled to mixer M1 and switch SW2, respectively. RF receiver module 105 may further include an amplifier U2 coupled between RF input 102 and splitter 104.

RF receiver module 105 further includes a second bandpass filter FT2 coupled to an output of mixer M2, and a baseband I/Q demodulator U5 coupled to bandpass filter FT2 either directly or through an amplifier U4. Baseband I/Q demodulator U5 may be a conventional I/Q demodulator and includes a pair of mixers M3 and M4 coupled to a signal splitter 132 and to a 90° hybrid H1. In one embodiment, 90° hybrid H1 has an input 136 that is coupled to the crystal reference generator XTAL1 either directly or through a second frequency divider DV2.

The components for forming the homodyne I/Q demodulator may further include some or all of a chain of amplifiers and filters for each of the I and Q channels including a pair of lowpass filters FT3 and FT4 coupled to mixers M1 and M2, respectively, a first pair of amplifiers U6 and U7 coupled to lowpass filters FT3 and FT4, respectively, an optional second pair of amplifiers U8 and U9 coupled to amplifiers U6 and U7, respectively, a pair of bandpass filters FT6 and FT5 coupled to respective ones of the second or the first pair of amplifiers, and a third pair of amplifiers U10 and U11 coupled between bandpass filters FT5 and output I, and between bandpass filter FT6 and output Q, respectively.

In one embodiment of the present invention, switch SW1 and SW2 are single pole, double-throw (SPDT) switches each having two switching terminals and a common terminal for connecting with a selected one of the switching terminals. SW1 has its common terminal coupled to the 90° hybrid 120 through amplifier U1, and its two switching terminals coupled to output 112 of frequency synthesizer 110 and output 116 of frequency divider DV1, respectively. SW2 has its common terminal coupled to mixer M2 and its two switching terminals coupled to splitter 104 and amplifier U3, respectively.

FIG. 1 shows that RF receiver 100 is configured as a homodyne receiver by having switch SW1 configured to connect output 112 of frequency synthesizer 110 to amplifier U1 and SW2 configured to connect mixer M2 to splitter 104. The bold lines in FIG. 1 denote signal paths for the homodyne configuration, which include an I-channel signal path through mixer M1, lowpass filter FT3, amplifiers U6 and U8, bandpass filter FT5, and amplifier U10, and a Q-channel signal path through mixer M2, lowpass filter FT4, amplifiers U7 and U9, bandpass filter FT6, and amplifier U11. An attenuator AT1 for creating an insertion loss of, for example, 1 dB, may be inserted between signal splitter 104 and mixer M1 to compensate for the small loss of the SPDT switch SW2 and to maintain balance between the I and Q channels.

During operation in the homodyne configuration, the frequency $f_{cw1}$ of the first CW signal at output 112 of frequency synthesizer 110 is tuned to be about the same as an input RF signal received at the RF input 102. The first CW signal, after bypassing divider DV1 and passing through SW1 and amplifier U1, is applied to the I-channel mixer M1, and is phase-shifted by 90 degrees before being supplied to the Q-channel mixer M2. Mixers M1 and M2 down-convert the input RF signal from amplifier U2 to low-frequency (e.g., <4 MHz) baseband I and Q signals, which are then amplified and filtered while traveling through the rest of the I-channel and Q-channel and output at signal outputs I and Q for appropriate decoding thereafter to extract baseband information in the input RF signal.

When the switch configuration is inverted, RF receiver 200 becomes a heterodyne or superheterodyne receiver, as shown in FIG. 2, wherein bold lines again denote active signal paths in this superheterodyne configuration. Following the signal paths, the RF input signal is directed to mixer M1, and then passes from mixer M1 to mixer M2 through bandpass filter FT1, amplifier U3, and switch SW2, which is now configured to connect mixer M2 to amplifier U3. The frequency $f_{cw1}$ of the first CW signal at output 112 of frequency synthesizer 110 is tuned to be below the frequency $f_{in}$ of the RF input signal, with the difference between frequency $f_{cw1}$ and frequency $f_{in}$ being the second IF frequency. The frequency $f_{cw1}$ is then divided by two using the divider DV1, which is included in the signal path because switch SW1 is now configured to connect output 116 of DV1 to amplifier U1. The second CW signal with the divided frequency $f_{cw2}$ is used to perform conversions at both mixers M1 and M2.

The first conversion, in mixer M1, produces a first intermediate frequency (IF) signal at an IF frequency $f_1 = f_{in} - f_{cw2} = f_{in} - f_{cw1}/2 \cong f_{in}/2$. Because the first intermediate signal has a frequency $f_1$ about half of the input frequency $f_{in}$, it is rejected by the lowpass filter FT3 and is thus directed through bandpass filter FT1. The bandpass filter FT1 is selected to have a center frequency near the first IF $f_1$ or to have a passband containing the first IF $f_1$. So, the bandpass filter FT1 would allow the first IF signal to pass to mixer M2, where it is again mixed with the second CW signal, which is phase-shifted by 90 degrees because of the 90° hybrid 120. The phase shifting, however, is of no consequence in a conventional double-conversion configuration.

The output from mixer M2 is a second IF signal having a second IF frequency $f_2 = f_1 - f_{cw1}/2 = f_{in} - f_{cw1}$. In one embodiment, the second IF frequency, or the difference between RF input frequency $f_{in}$ and frequency of the first CW signal generated by the frequency synthesizer 110, is selected to be significantly higher than the baseband frequency $f_{bb1}$ of the homodyne configuration. So, the second intermediate signal would be rejected by the lowpass filter FT4 and be directed to bandpass filter FT2, which is selected to have a center frequency close to the second IF frequency and is thus configured to allow the second IF signal to pass and be amplified by amplifier U4 and demodulated by demodulator U5. Demodulator U5 receives the crystal reference signal through the frequency divider DV2, which signal is used by mixers M3 and M4 to further down convert the second IF signal to I and Q signals having a baseband frequency $f_{bb2} = f_2 - f_{ref}/2$, which are output through outputs I and Q.

Figure 2:
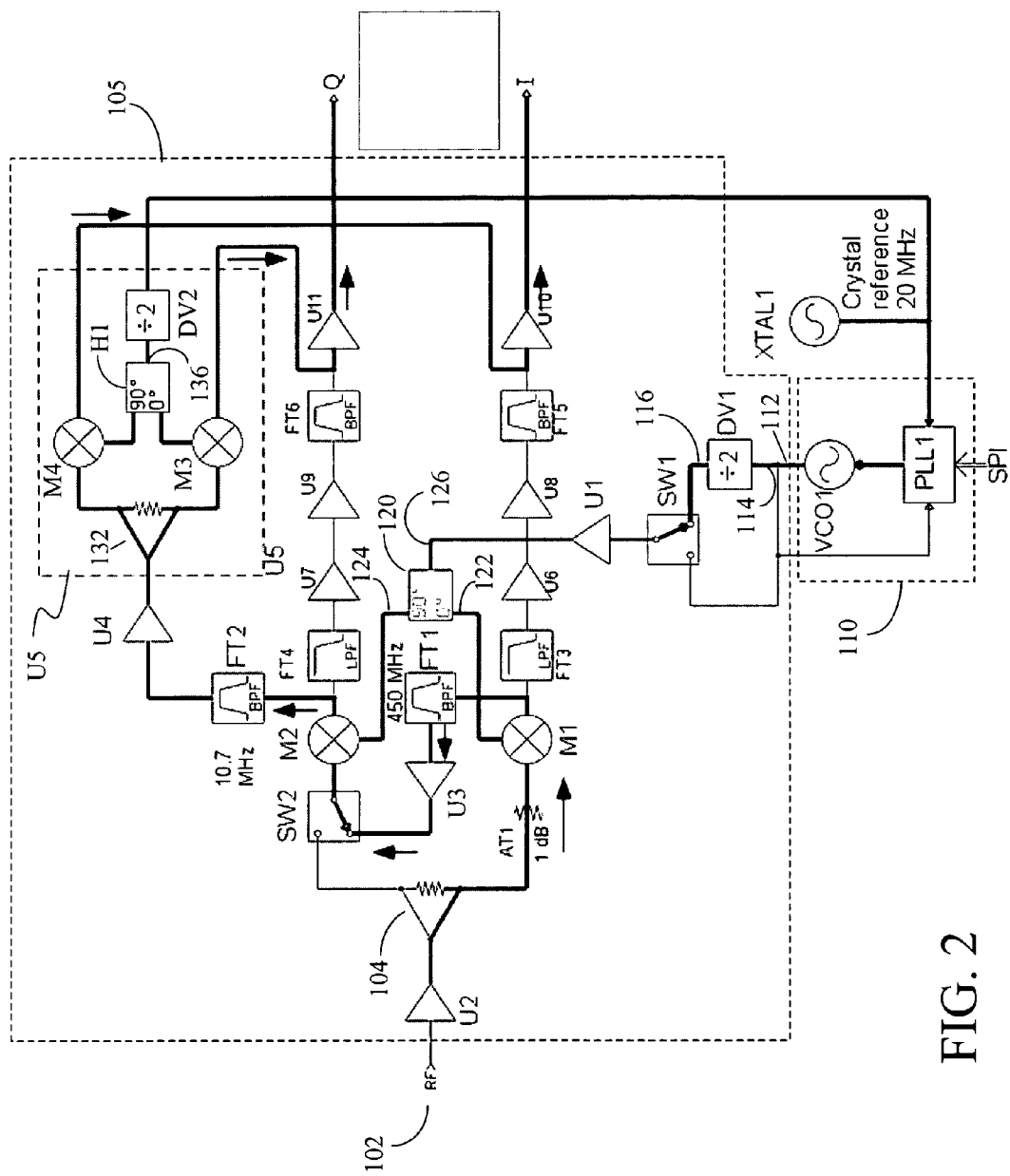
FIG. 2 is a block diagram of the configurable homodyne/heterodyne RF receiver configured as a superheterodyne receiver according to one embodiment of the present invention.

In one embodiment, the input frequency $f_{in}$ lies in the ETSI RFID band of 865-868 MHz, the crystal reference frequency is selected to be 20 MHz, the second IF frequency $f_2$ is selected to be 10.7 MHz, and the frequency of the frequency synthesizer 110 is tuned to be 10.7 MHz less than the input frequency $f_{in}$. So the first IF frequency $f_1$ is about 450 MHz, and the baseband frequency $f_{bb2}$ is about 0.7 MHz. Accordingly, bandpass filter FT1 is selected to have a center frequency of about 450 MHz, and bandpass filter FT2 is selected to have a center frequency of about 10.7 MHz, as shown in FIGS. 1 and 2.

The operation of RF receiver 100 in the superheterodyne configuration and using the above exemplary frequency plan is illustrated in FIG. 3 with switches SW1 and SW2 omitted and only those components active in the superheterodyne configuration shown. As shown in FIG. 3, frequency synthesizer 110, including a voltage controlled oscillator VCO1 and a phase-locked loop PLL1, and controlled by frequency reference XTAL1, has its frequency fowl set to be 10.7 MHz below the input frequency $f_{in}$, and divided by two in frequency divider DV1 to result in the common LO frequency for mixers M1 and M2. For clarity, FIG. 3 shows an input frequency $f_{in}$ of 865.3 MHz, but it will be understood that the scheme is applicable to any input frequency within the bands for which receiver 100 is designed. In particular, RF receiver 100 can be employed for the U.S. Industrial, Scientific, and Medical (ISM) band of 902-928 MHz, as well as the ETSI RFID band of 865-868 MHz.

The LO signal at the half frequency $f_{cw2}$ is then employed to convert, in mixer M1, the input frequency $f_{in}$ to the first IF frequency $f_1$, which is about 450 MHz. Because of the high value of the first IF frequency $f_1$ relative to the input frequency $f_{in}$, good image rejection can be achieved by using an input band filter (not shown) that will readily reject image frequencies. In the example shown in FIG. 3, where the input frequency $f_1$ is at 865.3 MHz, the frequency synthesizer 110 should be tuned such that $f_{cw1}$=(865.3−10.7) MHz=854.6 MHz, which, after dividing by half, gives rise to an LO frequency $f_{cw2}$ at 427.3 MHz. So the image frequency is low enough to be readily rejected by the RF components that precede mixer M1.

Note that the first IF frequency should vary slightly in order to allow for the same LO signal to be used for the conversion at mixer M2 to the second IF frequency of 10.7 MHz. Because of the variations in the first IF frequency, channel selection should be done following the second conversion at mixer M2. This second conversion, in mixer M2, uses the same LO signal at half-frequency from divider DV1 and amplifier U1, to produce an output at the second IF frequency of 10.7 MHz, which is a very common value used in low-cost FM radio receivers and other similar applications. The use of this frequency for the second IF frequency means that a wide variety of low-cost channel filters are commercially available.

Thus, channel selectivity is accomplished by the 10.7-MHz filter FT2, through which the signal must pass after the second conversion. Demodulator U5, which can be an inexpensive commercial I/Q demodulator, is used to convert the complex signal to separate I and Q components. The crystal reference signal from crystal reference generator XTAL1 has its frequency divided by half through frequency divider DV2 to a frequency of 10 MHz, and is mixed with the second IF output from U4 in mixers M3 and M4, to create in-phase and quadrature signals at 0.7 MHz.

Figure 3A:
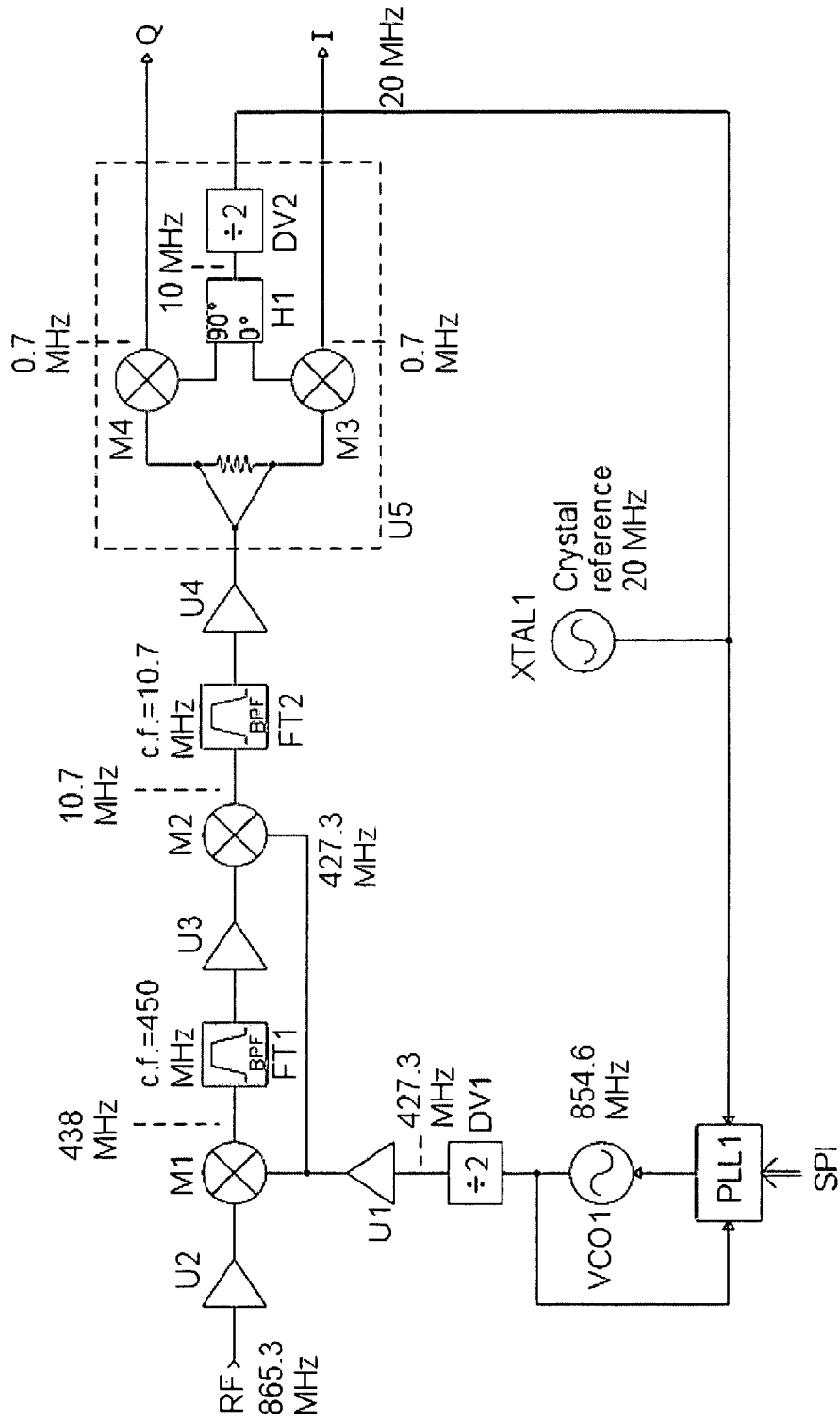
FIG. 3A is a block diagram of part of the configurable homodyne/heterodyne RF receiver relevant for the superheterodyne configuration according to one embodiment of the present invention.

The heterodyne configuration shown in FIG. 3A works to detect the presence of a signal without having to demodulate the signal to obtain the information contained therein. There are various unwanted or spurious output frequencies (spurs) present in the output of M1 arising from mixing of harmonics of the LO and input signals. In particular, the product known as a 3×1 spur is the difference of the third harmonic of the LO signal and the input signal. In the example shown in FIG. 3A, the mixer M1 mixes the signal at an input frequency (here shown as 865.3 MHz) from U2 with the LO signal, here shown as 427.3 MHz, from U1. The wanted output signal is the difference frequency (865.3−427.3)=438 MHz. This signal is 10.7 MHz higher in frequency than the LO, and will be down-converted to the desired 10.7 MHz second IF in mixer M2. However, the 3×1 spur has the frequency of (3*427.3−865.3)=(1281.9−865.3)=416.6 MHz, which is 10.7 MHz lower in frequency than the LO, but is still generally within the passband of filter FT1. Thus, the 3×1 spur will also be converted in mixer M2 to 10.7 MHz. The resulting second IF signal is thus the sum of the wanted and spurious first IF signals, which may result in degraded signal-to-noise ratios if the received signal is to be demodulated to extract the information therein.

Figure 3B:
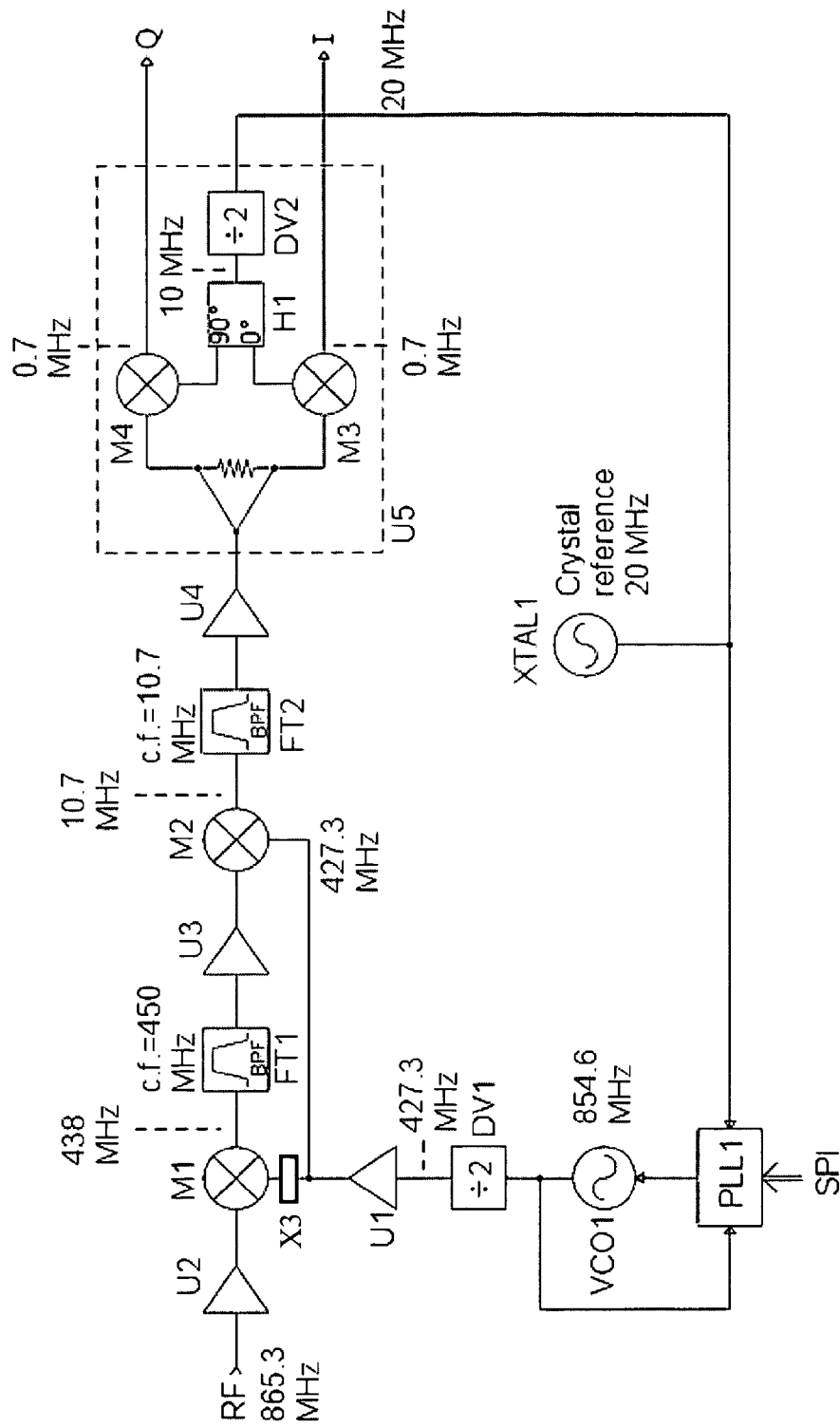
FIG. 3B is a block diagram of part of the configurable homodyne/heterodyne RF receiver relevant for the superheterodyne configuration according to an alternative embodiment of the present invention.

One option for solving the problem of spurs in the heterodyne configuration shown in FIG. 3A is to introduce a 3× analog multiplier ×3 between amplifier U1 and mixer M1, as shown in FIG. 3B. Multipliers that can be used as the 3× analog multiplier ×3 are well known and can be constructed using a symmetric limiter and filter or various other approaches. Additional amplification (not shown) may be needed to return the signal to an appropriate level after the multiplier. After the multiplier, the LO signal delivered to mixer M1 is now at three times the frequency of the output of divider DV1. In the example shown in FIG. 3B, the frequency-tripled LO signal is at 1281.9 MHz, and if this signal is mixed with the input frequency at 865.3 MHz, a first IF at 416.6 MHz is obtained, which will then be converted by the un-multiplied LO signal at the frequency of 427.3 MHz to the second IF of 10.7 MHz in mixer M2. Since there is no 427.3 MHz signal at the LO port of mixer M1, there is only one output signal of mixer M1 within the passband of FT1, and the spurious output problem is removed.

The above frequency plan can be modified so that the first IF is higher than the unmodified LO signal. In this case, a fundamental of 876 MHz from VCO1, producing a divided signal of 438 MHz from frequency divider DV1, can be used. The tripled frequency of 1314 MHz mixed with the RF input at 865.3 MHz produces a first IF of 448.7 MHz, again within the passband of the filter FT1, and the first IF is mixed with the 438 MHz LO signal in M2 to produce the wanted 10.7 MHz second IF.

The second IF signal is thereafter selected by bandpass filter FT2 and demodulated by the demodulator U5 into separate I and Q components, which can be readily digitized with A/D converters (not shown) and be decoded thereafter to extract low-frequency information in the RF input signal.

Figure 4:
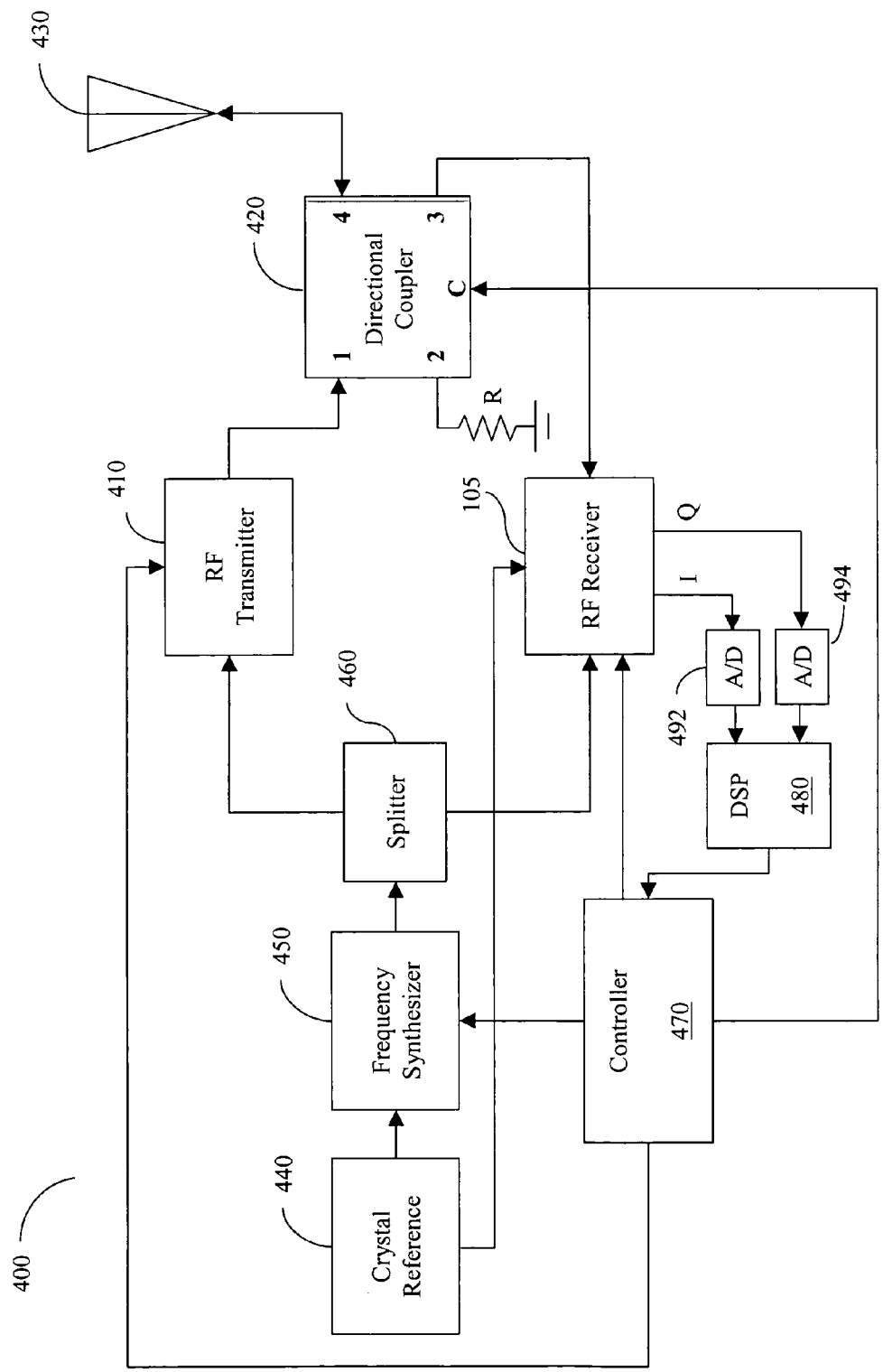
FIG. 4 is a block diagram of an LBT RFID reader employing the configurable homodyne/heterodyne RF receiver according to one embodiment of the present invention.

RF receiver 100 may be employed by an RFID reader to facilitate a listen-before-talk function required by the proposed ETSI Standard, EN302 208-1, for RFID operations. FIG. 4 illustrates an RFID reader 400 including receiver 100, according to one embodiment of the present invention. As shown in FIG. 4, RFID reader 400 generally includes an RF transmitter module 410 and RF receiver module 105 connected to an antenna 430 via a directional coupler 420. Directional coupler 420 separates received signals from transmitted signals and thus allows RF transmitter module 410 and RF receiver module 105 to share a same antenna or same set of antennas 430. A circulator may also be employed in place of the directional coupler 420 for this function.

RFID reader 400 further includes a local oscillator 440 similar to the local oscillator XTAL1 in RF receiver 100, a frequency synthesizer 450 similar to the frequency synthesizer 110 in RF receiver 100, and a splitter 460 configured to split the first CW signal produced by frequency synthesizer 110 into a first portion and a second portion. RFID reader 400 further includes a microcontroller 470 coupled to frequency synthesizer 450, RF transmitter module 410, RF receiver module 105, and directional coupler 430. RFID reader 400 may also include a digital signal processor 480 coupled to microcontroller 480 and to RF receiver module 105 via analog to digital (A/D) converters 492 and 494 each for converting signals output from I and Q channels, respectively, in the RF receiver module 105 into digital forms.

In one embodiment, RF transmitter module 410 is configured to modulate and amplify the first portion of the first CW signal to form a transmit signal, and RFID reader 400 is configured to operate in two different modes, a LISTEN mode and an INTERROGATE mode. In the INTERROGATE mode, RF receiver module 105 is configured as a homodyne receiver by having switch SW1 configured to connect output 112 of frequency synthesizer 110 to amplifier U1 and SW2 configured to connect mixer M2 to splitter 104, as discussed above. In LISTEN the mode, RF receiver module 105 is configured as a superheterodyne receiver by having switch SW1 inverted to connect output 116 of frequency divider 114 to amplifier U1 and SW2 inverted to connect mixer M2 to amplifier U3.

Microcontroller or microprocessor 470 is configured to control the operation of various modules, such as frequency synthesizer 450, RF transmitter module 410, RF receiver module 105, and directional coupler 420 by processing a plurality of input signals from the modules and/or producing a plurality of control signals that are used by respective ones of the modules. Some of the control signals are for switching the RFID reader 400 from being in the LISTEN mode to being in the INTERROGATE mode, or vice versa.

In the INTERROGATE mode, RF transmitter module 410 forms and transmits RF waves, which are used by RFID tags to generate response data according to information stored therein, while RF receiver module 105 detects reflected or backscattered signals from the tags at the same frequency, or, in the case of a chirped interrogation waveform, at a slightly different frequency. With the homodyne architecture, RF receiver module 105 detects the reflected or backscattered signal by mixing this signal with the second portion of the first CW signal from frequency synthesizer 450.

In the LISTEN mode, RF transmitter module 410 does not transmit, any received signal is directed to the RF receiver module via directional coupler 420, and the heterodyne configuration of RF receiver module 105 is used to perform the listen-before-talk operation, in which RFID reader 400 detects the presence of another signal within its intended sub-band of transmission and determines if the power level in the signal is below a certain limit before the RFID reader 400 switches to the INTERROGATE mode. The RF receiver module 105 in its heterodyne configuration provides improved sensitivity, selectivity, and dynamic range for the listen-before-talk operation.

Since the same pair of mixers M1 and M2, which are used in the normal INTERROGATE mode for I/Q conversion, are employed again in the LISTEN mode to allow for dual down conversion of received signal, minimal parts are required to be added to those in a conventional RFID reader to form RFID reader 400, and most of the additional parts, such as the RF switches SW1, SW2, frequency dividers DV1 and DV2, and some bandpass and lowpass filters, are commercially available and inexpensive. Thus, the inclusion of the RF receiver module 105 allows the RFID reader 400 to achieve considerable improvements in sensitivity, selectivity, and image rejection in the LISTEN mode without incurring significant additional costs.

Figure 5:
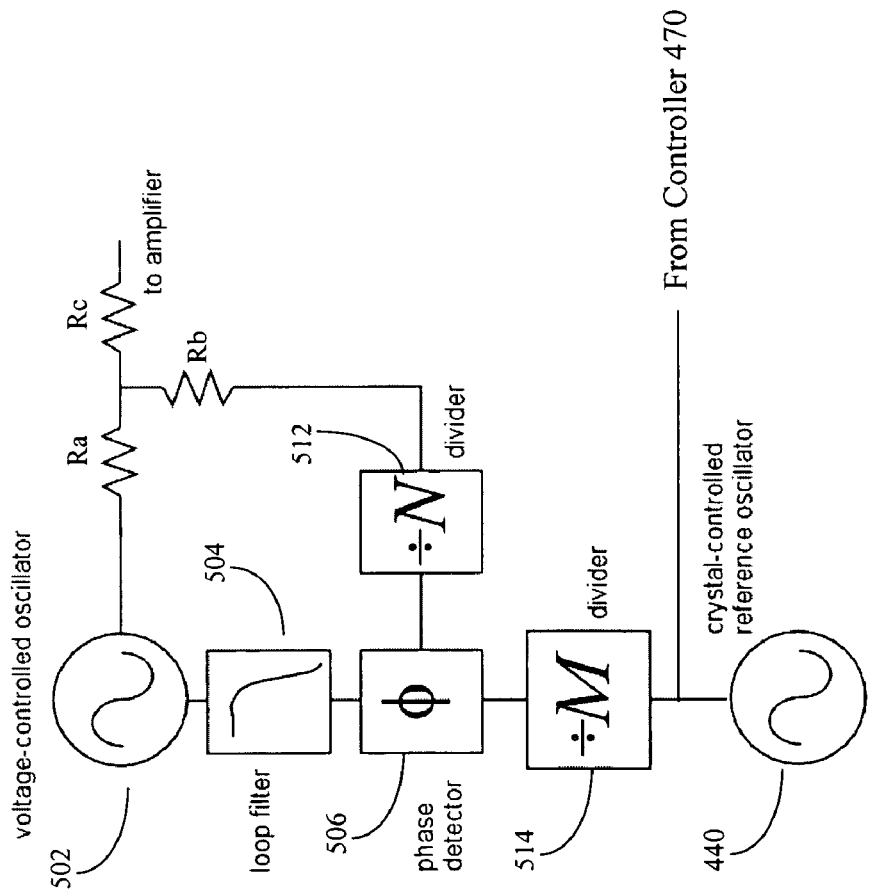
FIG. 5 is a circuit schematic diagram of a frequency synthesizer in the configurable homodyne/heterodyne RF receiver according to one embodiment of the present invention.

Like frequency synthesizer 110 in RF receiver 100, frequency synthesizer 450 in RFID reader 400 can be a conventional frequency synthesizer. FIG. 5 includes a block diagram of frequency synthesizer 450 (or 110) according to one embodiment of the present invention. Frequency synthesizer 450 includes a conventional phase-locked loop (PLL) operating for example at a carrier frequency near 900 MHz with reference to crystal oscillator 440 (or XTAL1) operating at a much lower frequency such as 20 MHz. As shown in FIG. 5, frequency synthesizer 450 includes a voltage controlled oscillator (VCO) 502 configured to generate an RF signal with a frequency near, for example, 900 MHz, a loop filter 504 coupled to the voltage controlled oscillator 502, a phase detector 506 coupled to the loop filter 504, a frequency dividers 512 coupled between the voltage controlled oscillator 440 and the phase detector 506, and a frequency divider 514 coupled between the phase detector 506 and crystal oscillator 440.

In one implementation, an 'integer-N' architecture is employed for frequency synthesis as illustrated in FIG. 5. A fraction of the output signal of VCO 502 is delivered to frequency divider 512 where it is divided by an integer N, whose value can be adjusted to obtain different output frequencies. The reference signal from crystal oscillator 440 is delivered to frequency divider 514 where its frequency is divided by a usually fixed integer M. The outputs of frequency dividers 512 and 514 are presented to two separate inputs of phase detector 506, which is configured to compare the phases of the two signals, and produce an output proportional to the phase difference between the two signals. Loop filter 504 is a low-pass filter configured to remove unwanted signal components from the output of the phase detector 506. The output of loop filter 504 is a DC voltage, which is used to control the phase and frequency of VCO 502.

The output frequency of the frequency synthesizer 450 must therefore be multiples of a step size, which is the reference frequency divided by integer M. In conventional RFID readers, the step size is typically 200 to 500 KHz. Since the PLL frequency offset by the desired IF is required for RFID reader 400 to operate in the LISTEN mode, and since the output frequency of frequency synthesizer 450 is divided by 2 before being delivered to mixers M1 and M2 in the LISTEN mode, a change in the synthesizer step size may be required for RFID reader 400 to operate in both LISTEN and INTERROGATE modes in the ISM band of 902-928 MHz and/or the ETSI RFID band of 865-868 MHz. Table 1 lists a frequency plan for the ISM band of 902-928 MHz specified by the RFID Gen 2 Standard for dense reader environments, and Table 2 lists a frequency plan for the ETSI RFID band of 865-868 MHz. Although the ISM band and ETSI RFID band have be used here as example, RFID reader 400 can be used for RFID applications in any frequency band with some adjustments of component values as long as the components with the adjusted values are available

TABLE 1

| CHANNEL | RF (MHz) | PLL (MHz) | LO (MHz) | IF1 (MHz) | IF2 (MHz) | LO2 (MHz) | IF2 (MHz) |
| --- | --- | --- | --- | --- | --- | --- | --- |
| 1 | 902.75 | 892.05 | 446.025 | 456.725 | 10.7 | 10 | 0.7 |
| 2 | 903.25 | 892.55 | 446.275 | 456.975 | 10.7 | 10 | 0.7 |

TABLE 1-continued

| CHANNEL | RF (MHz) | PLL (MHz) | LO (MHz) | IF1 (MHz) | IF2 (MHz) | LO2 (MHz) | IF2 (MHz) |
|---|---|---|---|---|---|---|---|
| * | * | * | * | * | * | * | * |
| * | * | * | * | * | * | * | * |
| * | * | * | * | * | * | * | * |
| 49 | 926.75 | 916.05 | 458.025 | 468.725 | 10.7 | 10 | 0.7 |
| 50 | 927.25 | 916.55 | 458.275 | 468.975 | 10.7 | 10 | 0.7 |

TABLE 2

| CHANNEL | RF (MHz) | PLL (MHz) | LO (MHz) | IF1 (MHz) | IF2 (MHz) | LO2 (MHz) | IF2 (MHz) |
|---|---|---|---|---|---|---|---|
| 1 | 865.1 | 854.4 | 427.2 | 437.9 | 10.7 | 10 | 0.7 |
| 2 | 865.3 | 854.6 | 427.3 | 438 | 10.7 | 10 | 0.7 |
| * | * | * | * | * | * | * | * |
| * | * | * | * | * | * | * | * |
| * | * | * | * | * | * | * | * |
| 15 | 867.7 | 857 | 428.5 | 439.2 | 10.7 | 10 | 0.7 |
| 16 | 867.9 | 857.2 | 428.6 | 439.3 | 10.7 | 10 | 0.7 |

In order to accommodate one or both of the above RF channels in the INTERROGATE mode and to provide the halved LO frequency in the LISTEN mode, the synthesizer step size needs to be reduced from the size used for a conventional receiver. For the ISM-band, it is appropriate to use a 50 KHz step size, rather than the 500 KHz step size used in conventional homodyne-only readers, in order to facilitate RFID operations at, for example, 902.75 MHz, with the homodyne configuration, and to monitor nearby signals at, for example, 892.05 MHz belonging to the same RF band, with the heterodyne configuration. For the ETSI band, it is appropriate to use a 100 KHz step size, rather than the 200 KHz step size used in conventional homodyne-only readers, in order to facilitate RFID operations at, for example, 865.1 MHz, with the homodyne configuration, and to monitor nearby signals at, for example, 854.4 MHz belonging to the same RF band, with the heterodyne configuration. While one can use adaptive filters to re-optimize the operation of the synthesizer for homodyne or heterodyne operation, this involves additional component cost and complexity. It is preferable to make use of the fixed loop filter design for the conventional frequency synthesizer with a different step size.

Figure 6:
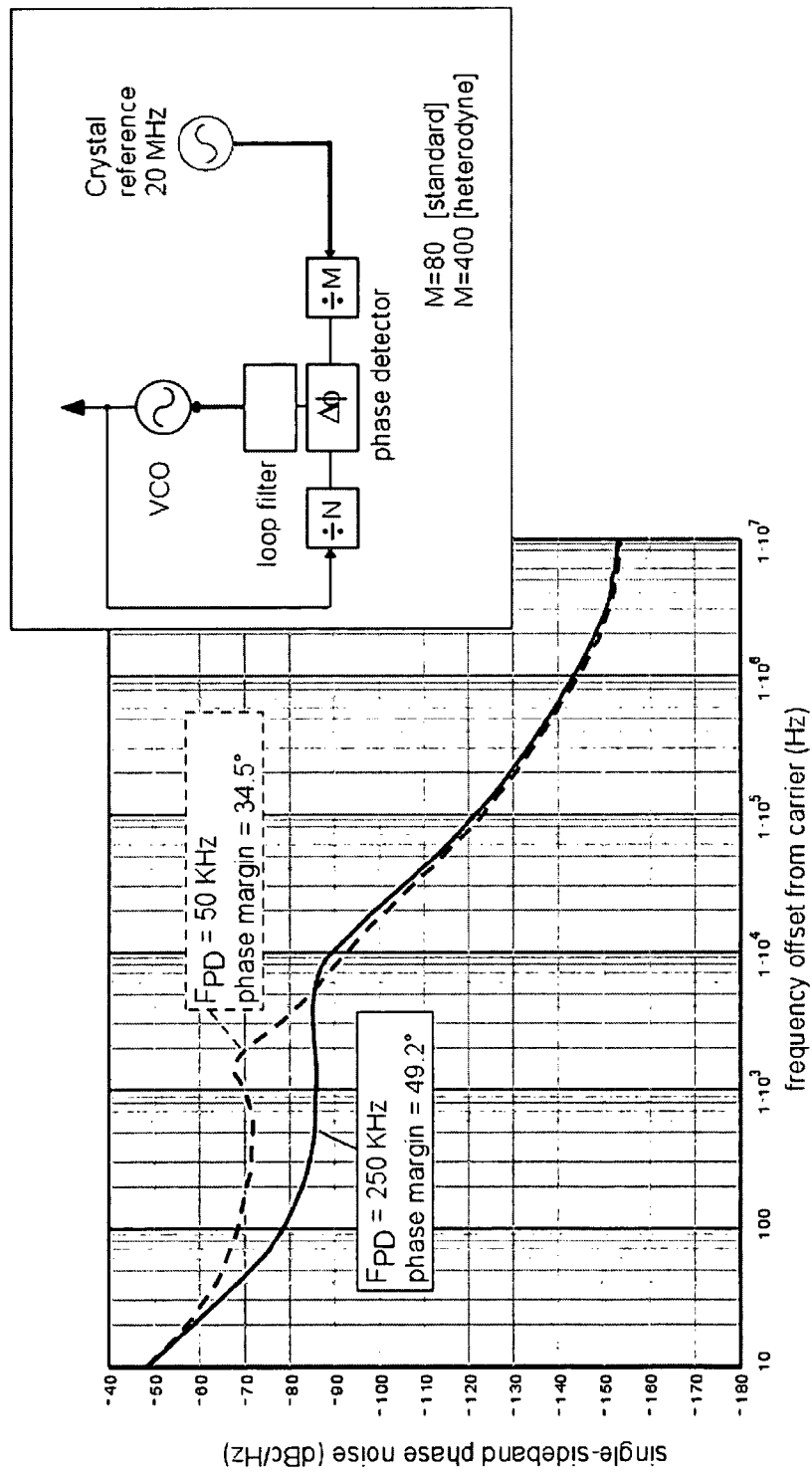
FIG. 6 is a chart showing simulated phase noise and phase margin versus offset from a carrier frequency for a conventional synthesizer with a loop filter optimized for 250-KHz compare frequency and operating with a 50-KHz compare frequency as compared to simulated phase noise and phase margin for the synthesizer operating with the usual 250-KHz compare frequency.

A simulation result is depicted in FIG. 6 to validate this design approach. The synthesizer loop filter 504 is a conventional design using passive components, optimized for a 250 KHz step size or compare frequency $F_{PD}$. The simulated phase noise vs. offset from the carrier for this condition is shown by the solid line in the graph, and the phase margin for stability in this case is estimated to be 49° as shown in the inset. The simulated results when the compare frequency is changed to $F_{PD}$=50 KHz are shown by the dotted line in the graph. The loop is still stable, albeit with a slightly reduced phase margin of 34.5°. Reducing $F_{PD}$ increases phase noise within the loop bandwidth and decreases the loop bandwidth. In a heterodyne architecture, however, the main contribution of VCO phase noise to receiver noise is at the lowest IF frequency, which, for example, is about 700 KHz. At 700 KHz offset from the carrier, the phase noise is dominated by the free-running noise of the VCO, and is the same for $F_{PD}$=50 or 250 KHz. Tuning speed is also slightly decreased using $F_{PD}$=50 KHz. But these minor disadvantages are more than compensated by the benefit of not having to employ an additional synthesizer for the RFID reader 400.

In addition to the change in compare frequency, the VCO must tune 10.7 MHz lower than the band edge, whereas in homodyne operation it must only tune to the center of the first channel above the band edge. Increasing the bandwidth of the VCO will degrade phase noise slightly, but as noted above, near-carrier phase noise is of little consequence for a heterodyne architecture radio.

FIG. 7 includes a table that summarizes the results of an analysis of the signal and noise power at various locations in the radio chain ('chain analysis') for the dual-down-conversion configuration. The mixer stages are cellular band devices, intended for low-IF operation, but measured at the frequencies specified in Table 1. Mixer performance degrades appreciably at LO frequencies around 450 MHz when compared to performance in the intended band of operation for these mixers, but the degraded performance is still sufficient to produce excellent overall results. The minimum discernable signal is as low as −111 dBm, which is significantly lower than −96 dBm required by ETSI EN 302 208.

Figure 7B:
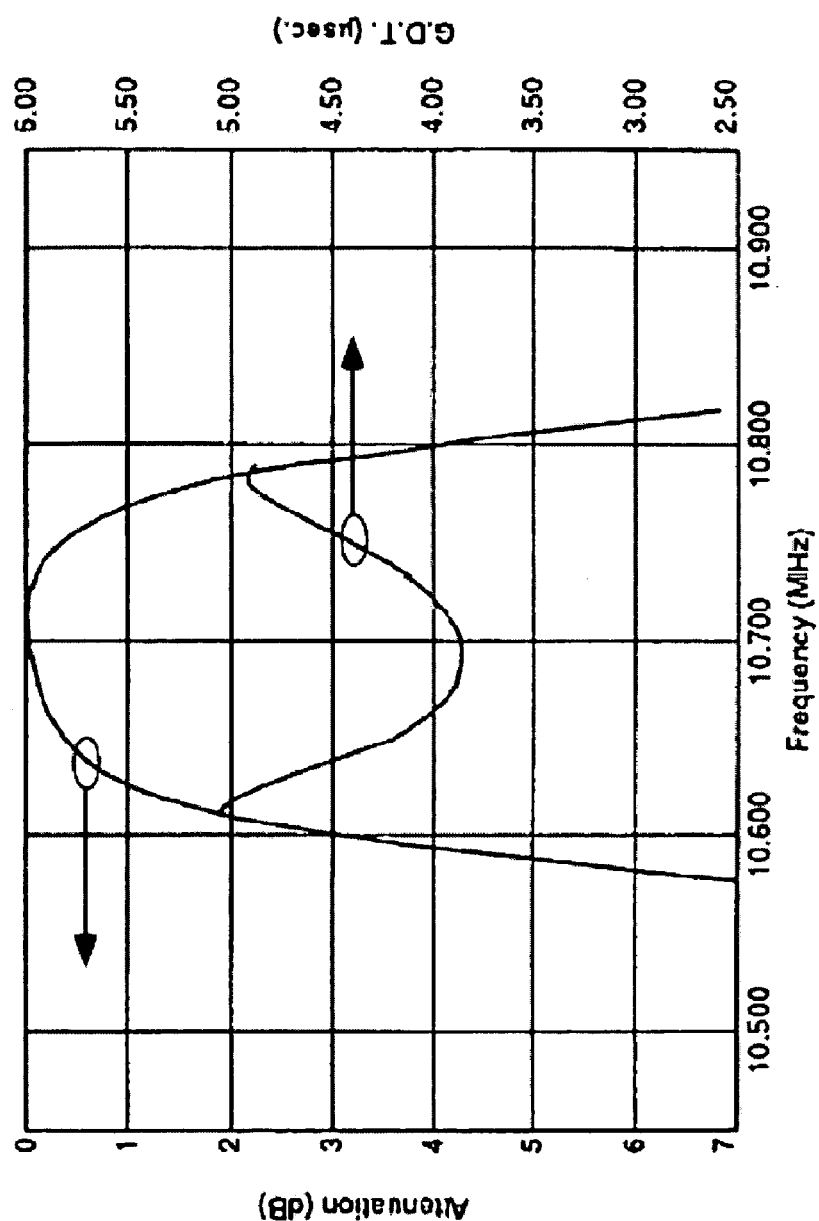
FIG. 7B is a chart illustrating amplitude and group delay time (G.D.T.) aspects of a commercially-available 180 KHz BW/10.7 MHz Filter's pass-band Response.
Figure 7C:
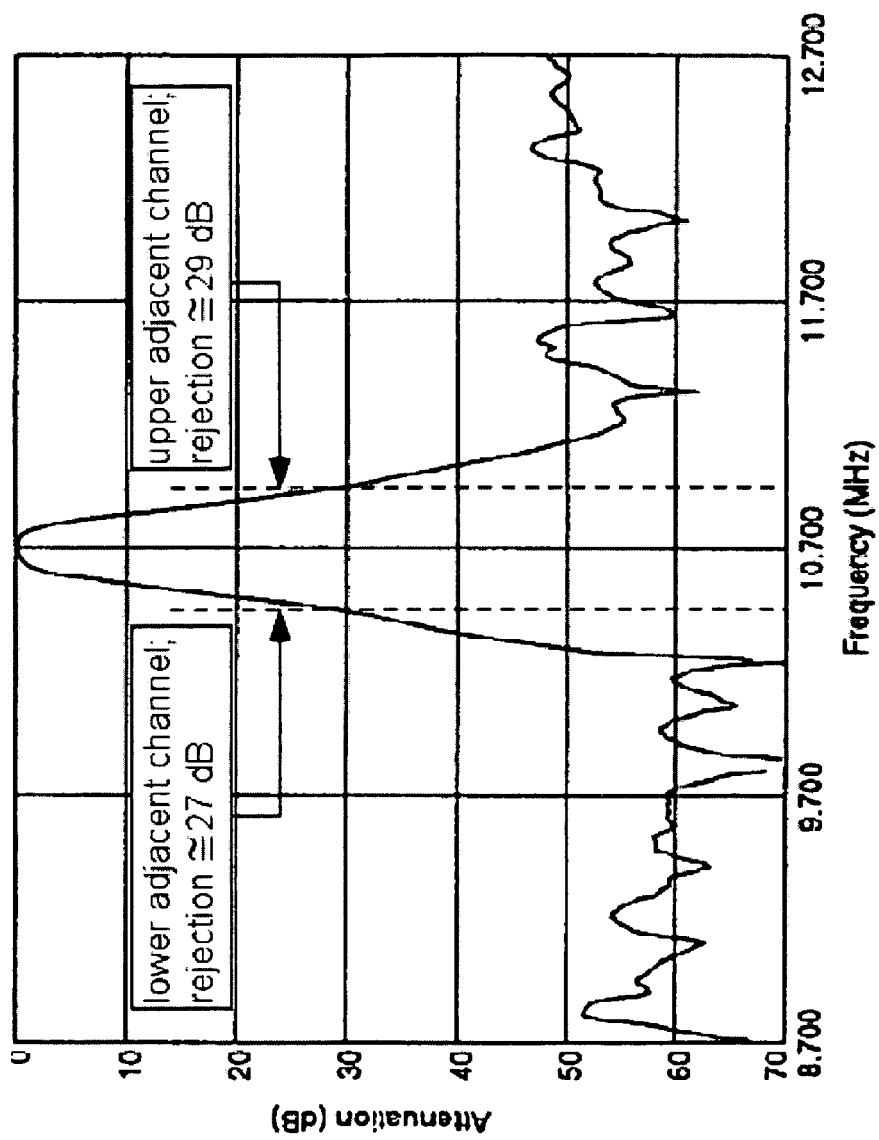
FIG. 7C is a chart illustrating reject-band response of the same commercially available 180 KHz BW/10.7 MHz Filter.

Furthermore, excellent selectivity is provided by the 10.7 MHz bandpass filter, due both to the low second-IF frequency chosen and the wide availability of high-performance, low-cost filters at this frequency, which is used in most low-cost FM receivers. The selectivity of a typical such filter is shown in FIG. 7B, and the rejection of adjacent and nearby channels is shown in FIG. 7C. This filter is chosen for US operation using a channel width of 500 KHz. Rejection of the neighboring channel, 250 KHz away from the nominal center frequency, can be as high as 27-30 dB. Similar performance can be obtained, by selecting a different commercial filter, for 200-KHz ETSI channels.

In either the INTERROGATE or the LISTEN mode, signals received at the antenna 430 are coupled to the RF receiver module 105 via directional coupler 420. Conventional directional couplers often introduce losses in the receive chain. These losses may be tolerable for an RFID reader operating in the INTERROGATE mode, where the range of passive tags is limited by the delivery of sufficient power to turn the tag on and not by the sensitivity of the reader. But in the LISTEN mode, these losses may be objectionable as the RFID reader is used as a pure receiver to detect nearby radios operating in the same sub-band.

To further improve the LISTEN mode operation, a switchable directional coupler, such as the one described in the commonly owned U.S. patent application Ser. No. 11/179,079 filed on Jul. 11, 2005, which is incorporated herein by reference in its entirety, is used as directional coupler 420. Thus, directional coupler 420 is switchable between at least two states, a normal state for the INTERROGATE mode and a bypass state for the LISTEN mode. In one embodiment, directional coupler 420 has a plurality of I/O ports, including port 1 that is coupled to RF transmitter 410, port 2 that is terminated to ground through a termination resistor R, port 3 that is coupled to RF receiver module 105, port 4 that is coupled to antenna(s) 430, and a control port, port C, for receiving a control signal to switch the state of the directional coupler from the normal state to the bypass state, or vise versa.

In the normal state, directional coupler 420 functions like a conventional directional coupler with port 1 being an input port, port 4 being a transmitted port, port 3 being a coupled port, and port 2 being an isolated port. Thus, directional coupler 420 in the normal state allows a large portion, such as 70% to 95%, of the transmit signal received at port 1 from RF transmitter 410 to pass via port 2 to antenna 430, and extracts a portion of the received RF signal arriving at port 4 from antenna 430, which extracted portion is output at port 3. In the bypass state, directional coupler 420 provides a low impedance path from port 4 to port 3 so that the received RF signal suffers a relatively modest loss in passing the directional coupler to reach the RF receiver. The bypass state is actuated when RFID reader is operating in the LISTEN mode.

Figures 8A, 8B:
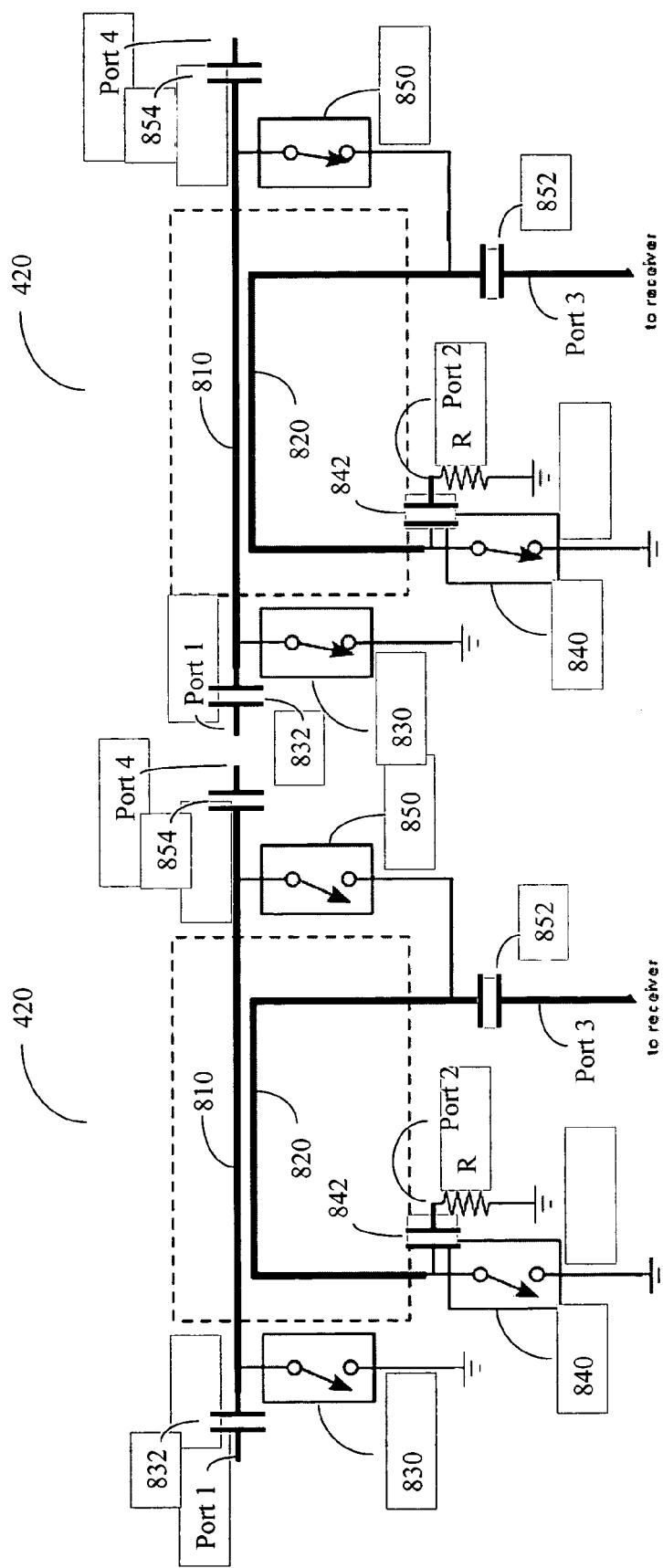
FIGS. 8A and 8B are schematic diagrams of a switchable directional coupler in normal and bypass states, respectively, according to one embodiment of the present invention.

As shown in FIGS. 8A and 8B, in one embodiment, directional coupler 420 includes a plurality of conductor lines, including a main line 810 extending between ports 1 and port 4 of directional coupler 420, and a secondary line 820 extending between port 8 and port 3 of directional coupler 420. Main line 810 and secondary line 820 may be part of a conventional quarter-wavelength transmission line directional coupler. In one embodiment, main line 810 and secondary line 820 each extends over a length of one-quarter wavelength corresponding to a center frequency of a frequency band in which RF transceiver 100 is designed to operate. Termination resistor R is coupled between secondary line 820 and ground.

Still referring to FIGS. 8A and 8B, directional coupler 420 further includes shunt switching elements (switches) 830, 840, and 850, which can be Single Pole, Single Throw (SPST) switches realized using positive intrinsic negative (PIN) diodes, field effect transistor (FET) switches, or other conventional means. Switch 830 is coupled between port 1 and ground, switch 840 is coupled between port 3 and ground, or in parallel with resister R, and switch 850 is coupled between port 3 and port 4. Directional coupler 420 may further include blocking capacitors 832, 842, 852, and 854 at port 1, port 2, port 3, and port 4, respectively.

In the normal state of directional coupler 420, switches 830, 840, and 850 are not actuated, as shown in FIG. 8A, so that each switch is in its "OFF" state and the directional coupler 420 functions as a conventional directional coupler, which separates signals based on the direction of signal propagation. In the normal state, switches 830, 840, and 850 are not placed in the signal paths of either the transmit signal or the received RF signal, and thus do not cause any series insertion loss to either the transmit signal or the received signal.

In the bypass state of directional coupler, switches 830, 840, and 850 are actuated, as shown in FIG. 8B, so that each switch is in its "ON" state and the directional coupler 420 becomes in one aspect a quarter-wave transformer and in another aspect a direct path for the received RF signal from antenna 430 to RF receiver module 105. As a quarter-wave transformer, directional coupler 420 with the switches actuated transforms a short between port 1 and ground created by switch 830 into an open circuit one-quarter wavelength down the main line 810 at port 4. Directional coupler 420 also transforms another short between port 8 and ground created by switch 840 into an open circuit one-quarter wavelength down the secondary line 820 at port 3.

Thus, in the bypass state, the transmit signal does not reach the antenna and directional coupler 420 draws almost no power from the received RF signal. The directional coupler 420 as a quarter-wave transformer also isolates the received RF signal from the short circuits at ports 1 and 3, so that the received RF signal from antenna 430 can be directed to RF receiver module 105 via the direct path provided by the actuated switch 850 and suffers only a modest loss (typically <1 dB) in traversing directional coupler 420, which loss is much smaller compared to a typical 10 dB or more loss that would have been encountered using a conventional directional coupler. So, directional coupler 420 provides almost unimpaired sensitivity in the LISTEN mode without affecting the normal operation in the INTERROGATE mode.

Figure 9:
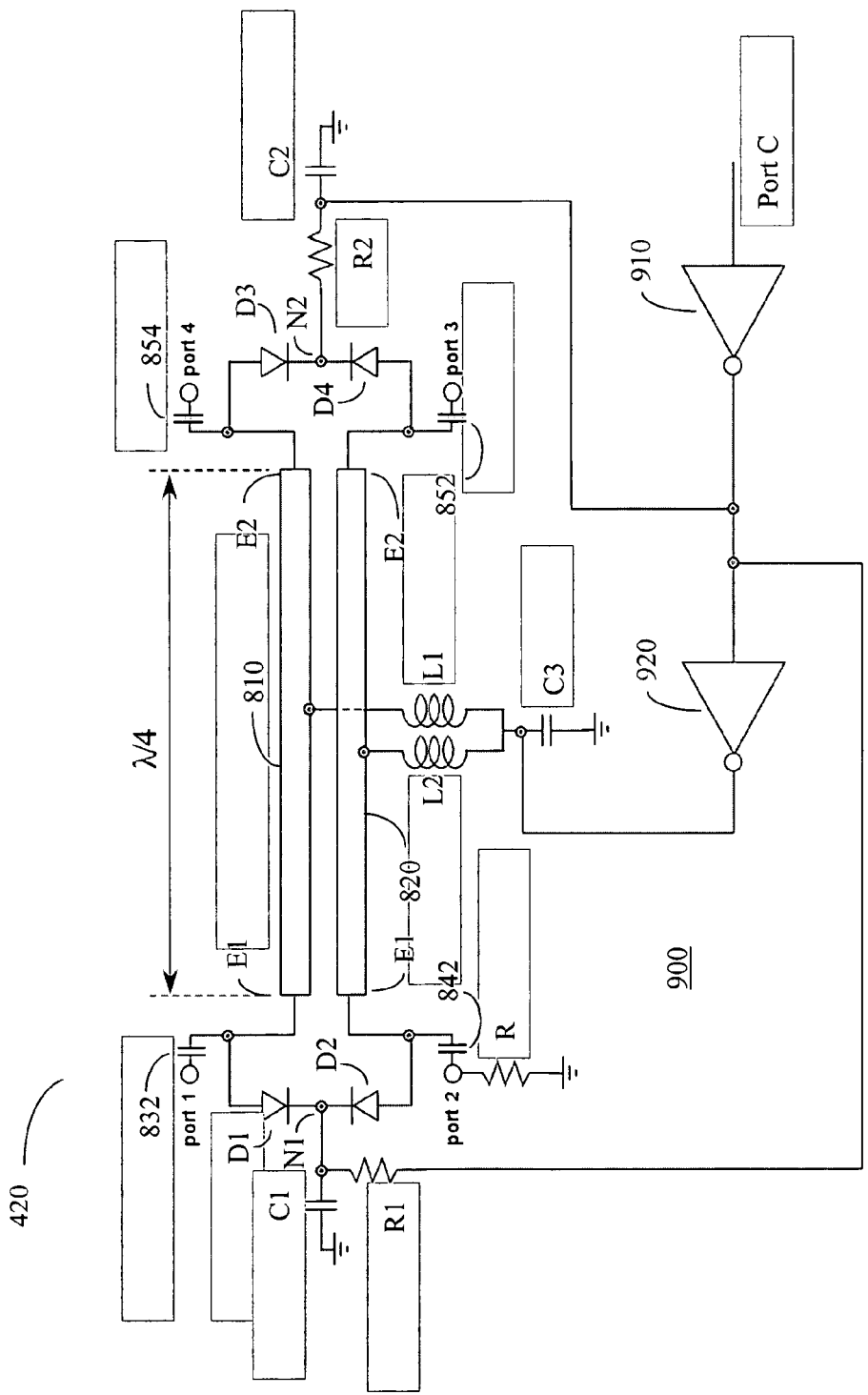
FIG. 9 is a circuit schematic diagram of one exemplary implementation of the switchable directional coupler according to one embodiment of the present invention.

FIG. 9 illustrates an exemplary implementation of directional coupler 420 according to one embodiment of the present invention. As shown in FIG. 9, directional coupler 420 comprises a pair of coupled quarter-wave length transmission lines 810 and 820 each extending between two ends, E1 and E2. Ends E1 of transmission lines 810 and 820 are terminated with a pair of PIN diodes D1 and D2, which are RF-grounded through a bypass capacitor C1. Ends E2 of transmission lines 810 and 820 are terminated with a pair of PIN diodes D3 and D4. In one embodiment, the pair of diodes D1 and D2 have a common node, which can be either a common cathode or anode, and the pair of diodes D3 and D4 have a common node, which can be either a common cathode or anode.

In one embodiment, each of the PIN diodes D1, D2, D3, and D4 comprises heavily doped "N" and "P" sections separated by an "intrinsic" section (I-region) of a semiconductor material. At microwave or RF frequencies, a PIN diode behaves like a resistor, whose resistance value is determined by the level of DC current through the diode. So, the PIN diode is essentially a DC-controlled high-frequency resistor. For example, a few milliamps of DC current can cause the PIN diode to short out an amp or more of RF current. If no DC current is present, the diode behaves almost like an open circuit, as the thickness of the intrinsic region of the PIN diode substantially reduces its parasitic capacitance.

The frequency at which the PIN diode transitions from acting like a diode to acting like a resistor is a function of the thickness of the I-region. Diodes with thicker I-region can be used as switches for lower frequencies.

To allow control of directional coupler 420 using controller 470, a drive circuit 900 is provided to control the DC currents through PIN diodes D1, D2, D3, and D4. An example of the drive circuit 900 is shown in FIG. 9 to comprise a pair of inverters 910 and 920, a pair of resistors R1 and R2, and a pair of inductors L1 and L2. In one embodiment, diodes D1 and D2 are biased using resistor R1, and diodes D3 and D4 are biased using resistor R2, with a current path closed through inductors L1 and L2 connected to the transmission lines 810 and 820, respectively. Inductors L1 and L2 are provided to isolate parts of the drive circuit 900 from RF signals in the transmission lines. In one embodiment, inductors L1 and L2 are RF grounded through a blocking capacitor C3, and diodes D3 and D4 are each RF coupled to ground through resistor R2 and a bypass capacitor C2. Furthermore, diodes D1 through D4 are each coupled to the control port, port C, of directional coupler through inverter 910. Inverter 920 is provided between resistor R1 or R2 and inductors L1 or L2 for biasing the transmission lines 810 and 820 against a circuit node N1 between diode pair D1 and D2 and a circuit node N2 between diode pair D3 and D4.

Figure 10:
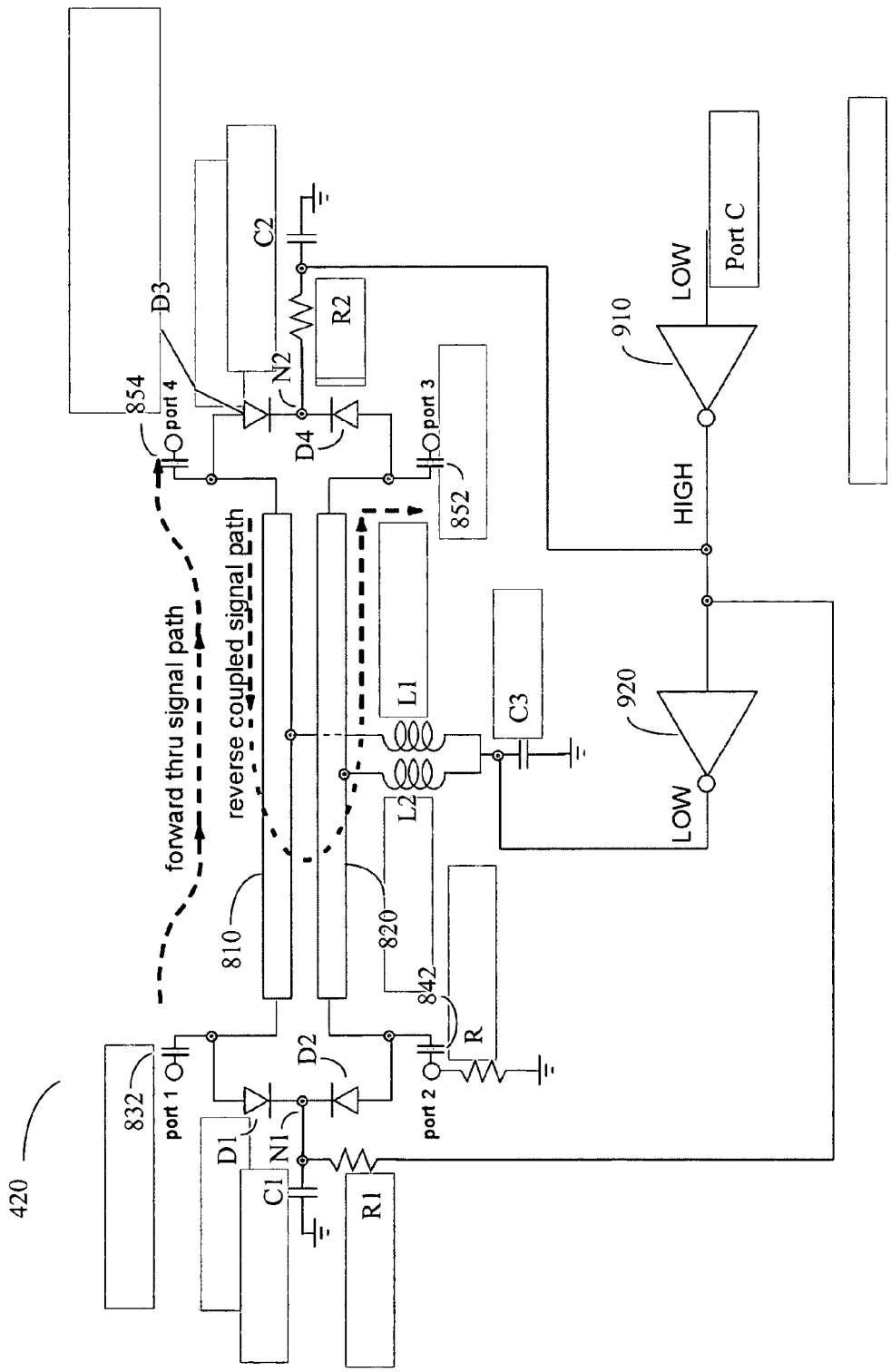
FIG. 10 is a circuit schematic diagram of the normal state of the switchable directional coupler.

Referring to FIG. 10, a logic LOW input at port C of directional coupler results in a logic high at circuit nodes N1 and N2 and a logic low at the transmission lines 810 and 820, causing the diodes to be reverse-biased and directional coupler 420 to be in the normal state. In this case, the transmit signal received at port 1 passes through conductor line 810 in a forward through signal path from port 1 to port 4 with a modest loss due to the relatively small parasitic capacitance associated with each of the diodes, and the received RF signal is coupled from port 4 to port 3.

Figure 11:
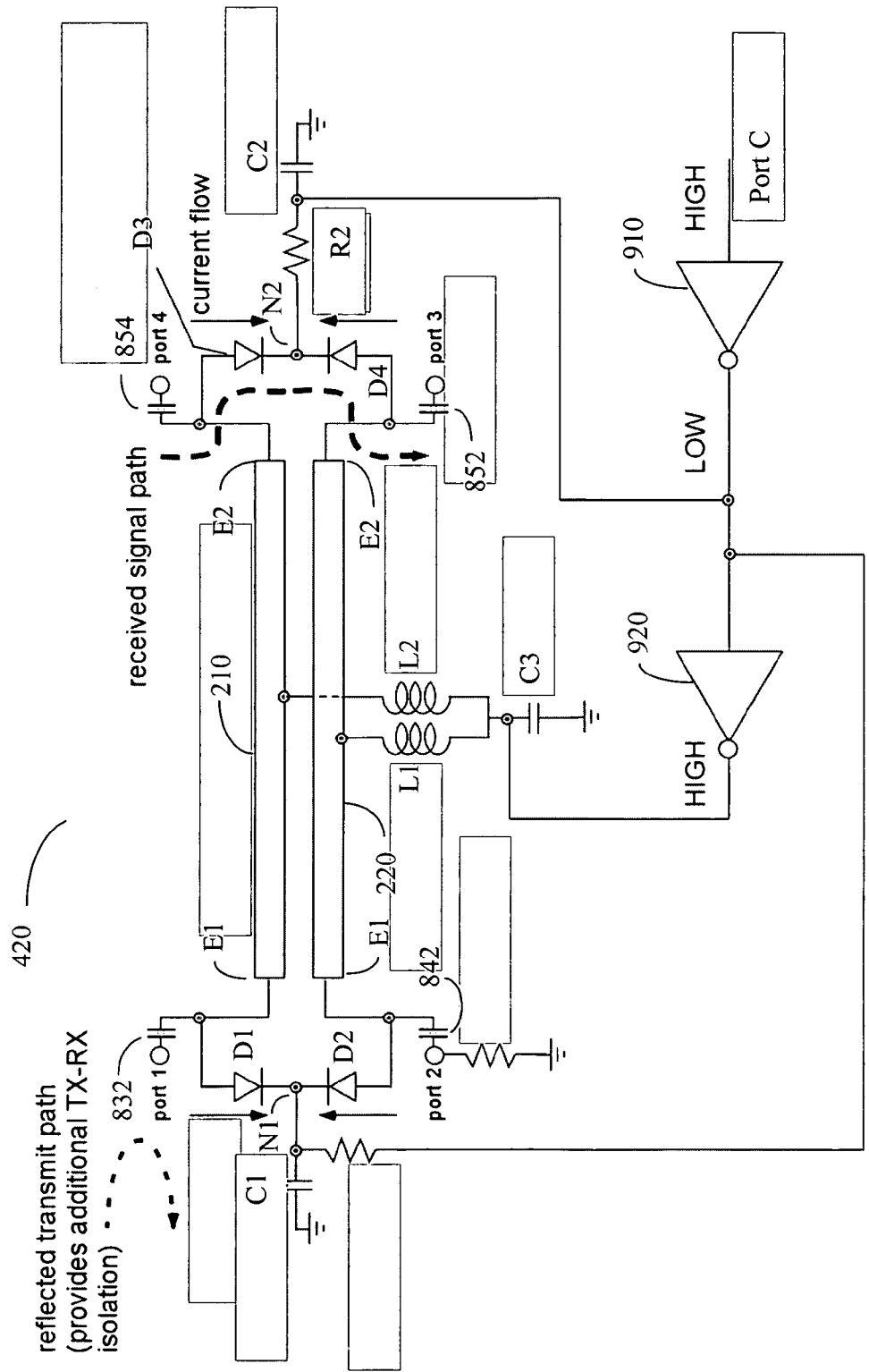
FIG. 11 is a circuit schematic diagram of the bypass state of the switchable directional coupler.

Referring to FIG. 11, when the logic input at port C is switched to HIGH, the diodes are forward-biased and become conducting, and directional coupler 420 is in the bypass state. In this condition, each diode presents very small impedance, and the received RF signal is shorted directly from the antenna coupled to port 4 to the receiver coupled to port 3. The shorted transmission lines present a large impedance to the transmit signal directed to port 1, and provide additional isolation between the transmit signal and the received RF signal. On the other hand, the shorts created by the conducting diodes D1 and D2 at ends E1 of transmission lines 810 and 820 are transformed into open circuits a quarter wavelength down transmission lines 810 and 820 at ends E2, so that transmission lines 810 and 820 draw almost no power from the received RF signal.

Thus, the biasing scheme shown in FIG. 9 allows the usage of a single supply voltage at the control port C to bias the PIN diodes D1 through D4. A conventional approach to biasing the PIN diodes would require blocking capacitors and bias networks for each diode, and a bipolar supply transistor to insure that the diodes are forward biased in the bypass state and remain reverse biased throughout an entire RF cycle in the normal state when a large RF power is present at port 1. The biasing scheme shown in FIG. 9 and discussed above minimizes complexity and parts count by biasing the diodes through the transmission lines 810 and 820. Blocking capacitors are used at the four ports, port 1 through port 4, to allow the DC potential of the transmission lines 810 and 820 to vary without affecting the RF functions of the directional coupler 420. Inverters 910 and 920 allow the full supply voltage to be placed across the diodes in the normal state to reverse bias the diodes, while providing bias current through resistors R1 and R2 in the bypass state when the diodes are forward biased. Since a single bypass capacitor C1 is used to supply bias to both shunt PIN diodes D1 and D2, the biasing scheme works for both common cathode or common anode diode pairs.

In order to present an acceptably small capacitive load in the bypass state, each of the PIN diodes should have relatively small capacitance (e.g., less than about 0.15 pF) when being forward biased. As a non-limiting example, the SMP1345-004 PIN diode commercially available from Alfa Industries, Inc., is an acceptable choice for each of the diodes D1, D2, D3, and D4. Also as a non-limiting example, each of resistors R1 and R2 has a resistance of about 930 ohm, each of capacitors C1, C2, and C3 has a capacitance of about 47 pF, and each of inductors L1 and L2 has an inductance of about 100 nH.

Figure 12A:
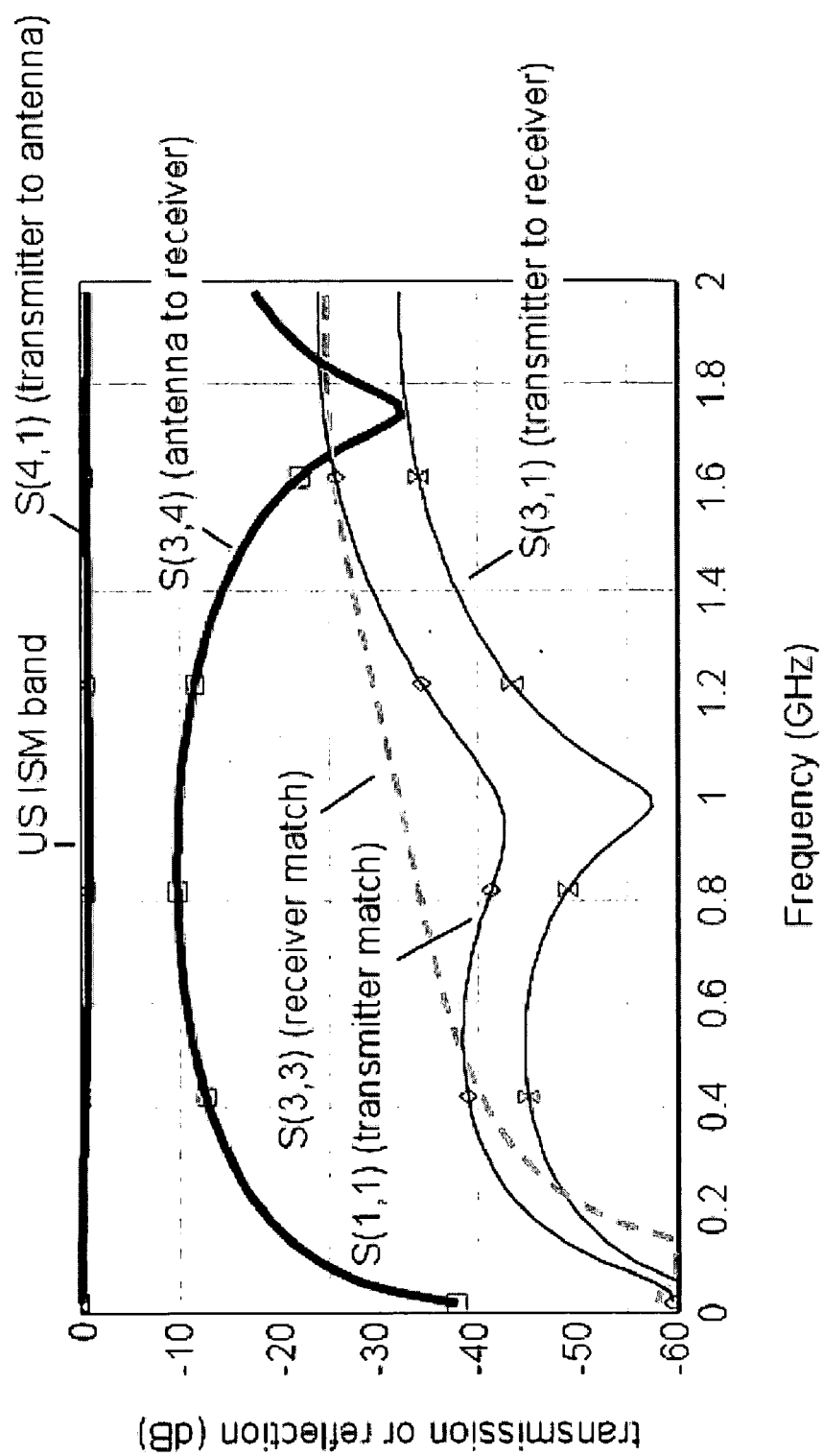
FIG. 12A is a chart illustrating simulation results for 4-port S-parameters of the switchable directional coupler in the normal state.

FIG. 12A shows the simulated S-parameters of directional coupler 420 in the normal state, with S(4,1) representing transmission loss from port 1 to port 4, S(3,4) representing coupling loss from port 4 to port 3, S(3,1) representing a degree of isolation between port 3 and port 1, S(1,1) representing transmitter match, and S(3,3) representing receiver match. As shown in FIG. 12, the transmit signal is passed from the RF transmitter coupled to port 1 to the antenna coupled to port 4 with minimal loss (S(4,1)). The received RF signal from the antenna, which is the wanted signal for the receiver, is passed to the receiver with about 10 dB of coupling loss (S(3,4)) in the US ISM band. Excellent isolation of over 50 dB in the US ISM band is provided between port 1 coupled to the transmitter and port 3 coupled to the receiver (S(3,1)), which is necessary for extracting the usually small received RF signals from the large transmit signal. The match to either the transmitter or the receiver (S(1,1) or S(3,3), respectively) are also excellent, better than −30 dB in the US ISM band.

Figure 12B:
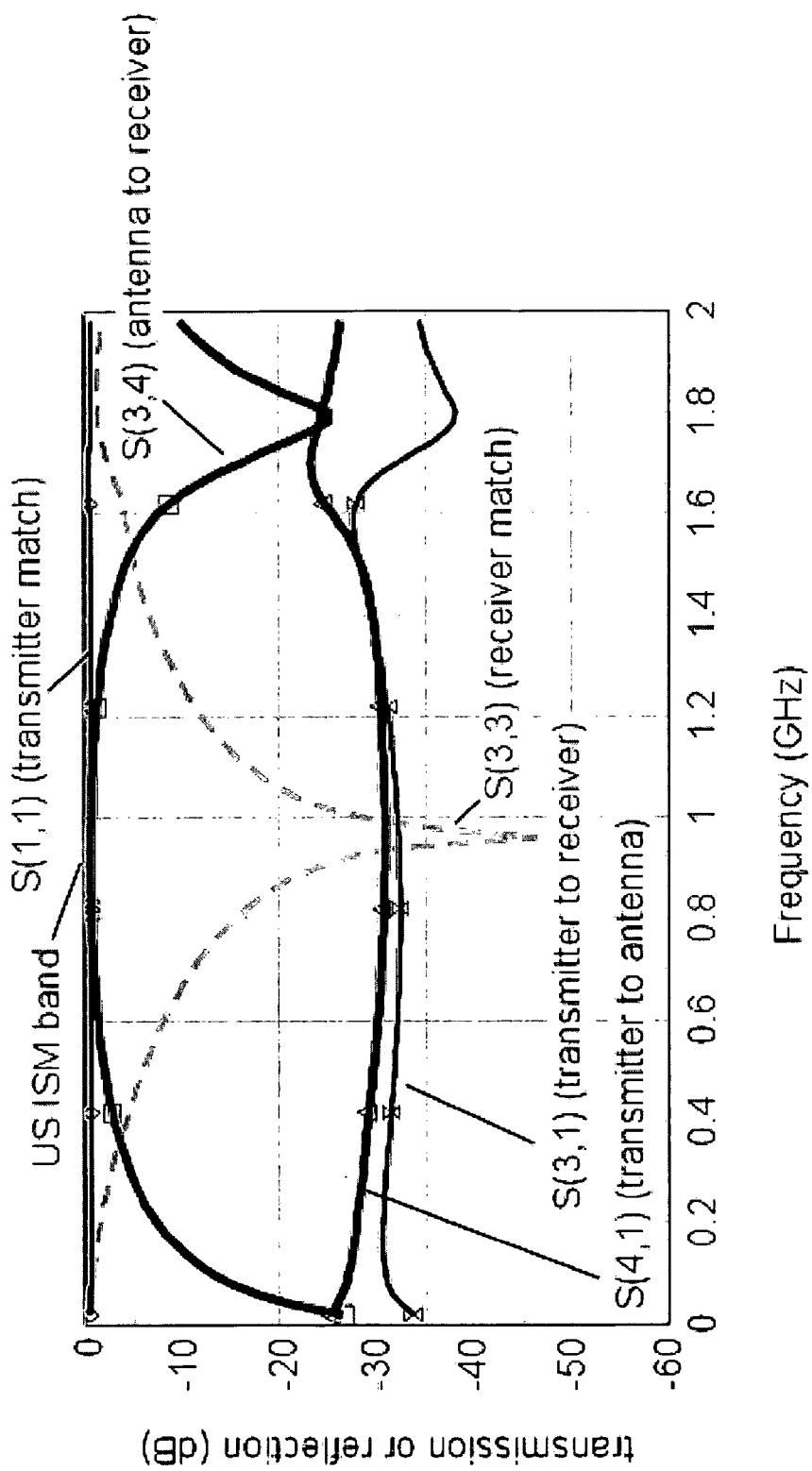
FIG. 12B is a chart illustrating simulation results for 4-port S-parameters of the switchable directional coupler in the bypass state.

FIG. 12B shows the simulated S-parameters of directional coupler 420 in the bypass state. The transmit signal is now mostly reflected, with S(1,1) nearly equal to 1. This high reflection is necessary to achieve good isolation between the transmit signal and the received RF signal, as any received signal that does enter the coupled lines can pass directly from the antenna to the receiver by way of the low-impedance diodes D3 and D4. The signal from the antenna (the wanted signal for the receiver), is passed directly to the receiver with negligible loss (S(3,4)). The match to the receiver port (S(3, 3)), being now provided by the quarter-wave transformer formed by the coupled conductor lines 210 and 220, is somewhat more narrow-banded than in the normal state, but still an excellent −25 dB in the target band. The transmitter is well-isolated from both the antenna and the receiver, with better than −30 dB loss in the target band ((S(4,1) and S(3,1)). This isolation may normally be combined with a powered-down state in the transmitter to ensure negligible degradation of the receiver sensitivity.

This invention has been described in terms of a number of embodiments, but this description is not meant to limit the scope of the invention. Numerous variations will be apparent to those skilled in the art, without departing from the spirit and scope of the invention disclosed herein. For example, some discussions have been couched in terms of some specific frequencies, but it will be understood that the construction of an appropriate frequency plan analogous to those illustrated by Table 1 or 2 is straightforward for any appropriate input frequencies. The choice of whether to employ the original design shown in FIGS. 1, 2, and 3A, or the variant design using a frequency-tripled LO signal shown in FIG. 3B, depends on a balance between the importance of receiver sensitivity and the cost of the additional components required, and thus depends on the application for the receiver.

I claim:

1. A radio frequency (RF) receiver having an RF input for receiving an RF signal and first and second signal outputs for outputting demodulated in-phase (I) and quadrature (Q) signals, comprising:
    a frequency synthesizer having an output for outputting a continuous wave signal at a specified frequency;
    a first frequency divider coupled to the output of the frequency synthesizer; first and second mixers coupled between the RF input and respective ones of the first and second signal outputs;
    a first RF switch coupled between the frequency synthesizer and the first and second mixers, and configurable to switch between utilizing and bypassing the frequency divider; and
    a second RF switch coupled to one of the first and second mixers and configurable to allow the first and second mixers to operate either in parallel or in series,
    wherein the RF receiver functions as a homodyne receiver when the first RF switch is configured to bypass the frequency divider and the second RF switch is configured to have the first and second mixers operate in parallel, and wherein the RF receiver functions as a heterodyne receiver when the first RF switch is configured to utilize the frequency divider and the second RF switch is configured to have the first and second mixers operate in series.

2. The RF receiver of claim 1, further comprising:
a baseband I/Q demodulator coupled between one of the first and second mixer and the first and second signal outputs.

3. The RF receiver of claim 2, further comprising:
a bandpass filter coupled between one of the first and second mixers and the baseband I/Q demodulator.

4. The RF receiver of claim 3, wherein the bandpass filter is configured to pass signals in a band of frequencies near 10.7 MHz.

5. The RF receiver of claim 4, wherein the baseband I/Q demodulator includes fourth and fifth mixers each coupled between the bandpass filter and a respective one of the first and second signal outputs.

6. The RF receiver of claim 2, further comprising:
a crystal reference generator for generating a reference clock signal that is provided to the frequency synthesizer as a reference signal and to the baseband I/Q demodulator as a local oscillator signal.

7. The RF receiver of claim 6, further comprising a second frequency divider coupled between the baseband I/Q demodulator and the crystal reference generator.

8. The RF receiver of claim 1, further comprising:
a bandpass filter coupled in series with and between the first and second mixers when the second switch is configured to have the first and second mixers operate in series, the bandpass filter having a passband including a frequency that is about half of the specified frequency for the frequency synthesizer.

9. The RF receiver of claim 1, further comprising:
a first low-pass filter coupled between the first mixer and the first signal output; and
a second low-pass filter coupled between the second mixer and the second signal output.

10. The RF receiver of claim 1, further comprising a 3X analog multiplier coupled between the first switch and one of the first and second mixers.

11. The RF receiver of claim 1, wherein the first and second RF switches are single-pole-double-throw (SPDT) switches.

12. An RF transceiver including the RF receiver of claim 1.

13. An RFID reader including the RF receiver of claim 1.

14. A method of operating an RFID reader, comprising:
operating the RFID reader as a heterodyne receiver to monitor other signals within an intended sub-band of transmission, wherein the RFID reader includes a frequency synthesizer and first and second mixers, and wherein operating the RFID reader as a heterodyne receiver comprises configuring a first switch in the RFID reader to couple a frequency divider between the frequency synthesizer and the first and second mixers and configuring a second switch in the RFID reader to allow the first and second mixers to operate in series; and
operating the RFID reader to interrogate at least one RFID tag, wherein operating the RFID reader to interrogate the at least one RFID tag comprises configuring the first switch in the RFID reader to bypass the frequency divider, and configuring the second switch in the RFID reader to allow the first and second mixers in the RFID reader to operate in parallel.

15. The method of claim 14, further comprising:
adjusting a change step size of the frequency synthesizer.

16. An RFID reader comprising:
an RF receiver module characterized in that the RF receiver module is configured as a homodyne receiver in an INTERROGATE mode and as a heterodyne receiver in a LISTEN mode, wherein the RF receiver module comprises:
a pair of mixers;
a first bandpass filter coupled to a first one of the pair of mixers and having a center frequency near a first predetermined intermediate frequency;
a second bandpass filter coupled to a second one of the pair of mixers and having a center frequency near a second predetermined intermediate frequency that is significantly lower than the first intermediate frequency; and
means for allowing the pair of mixers to operate in series in the LISTEN mode and in parallel in the INTERROGATE mode.

17. The RFID reader of claim 16, further comprising:
a baseband I/Q demodulator coupled to the second bandpass filter and configured to demodulate in the LISTEN mode a received signal that is twice down-converted by the pair of mixers.

18. An RF receiver comprising:
a pair of mixers, wherein the RF receiver is configurable between being a homodyne receiver and being a heterodyne receiver, and means for switching the pair of mixers to operate in parallel when the RF receiver is a homodyne receiver and in series when the RF receiver is a heterodyne receiver.

19. The RF receiver of claim 18, further comprising a frequency synthesizer configured to generate a continuous waver signal, wherein the continuous wave signal is used to down convert a received signal to baseband when the RF receiver is a homodyne receiver, and wherein the continuous wave signal has its frequency divided by half before being used to down convert a received signal to a first IF frequency and to a second IF frequency when the RF receiver is a heterodyne receiver.

* * * * *